US010490445B2

(12) United States Patent
Kamoshima et al.

(10) Patent No.: US 10,490,445 B2
(45) Date of Patent: Nov. 26, 2019

(54) SEMICONDUCTOR DEVICE AND METHOD OF MANUFACTURING THE SAME

(71) Applicant: Renesas Electronics Corporation, Tokyo (JP)

(72) Inventors: Takao Kamoshima, Hitachinaka (JP); Kojiro Horita, Hitachinaka (JP); Shuji Matsuo, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 91 days.

(21) Appl. No.: 15/684,702

(22) Filed: Aug. 23, 2017

(65) Prior Publication Data

US 2018/0090365 A1 Mar. 29, 2018

(30) Foreign Application Priority Data

Sep. 27, 2016 (JP) .................................. 2016-187772

(51) Int. Cl.
| | |
|---|---|
| *H01L 29/792* | (2006.01) |
| *H01L 21/768* | (2006.01) |
| *H01L 23/535* | (2006.01) |
| *H01L 27/11568* | (2017.01) |
| *H01L 29/06* | (2006.01) |
| *H01L 29/66* | (2006.01) |

(52) U.S. Cl.
CPC .... *H01L 21/7682* (2013.01); *H01L 21/76805* (2013.01); *H01L 21/76837* (2013.01); *H01L 21/76895* (2013.01); *H01L 23/535* (2013.01); *H01L 27/11568* (2013.01); *H01L 29/0649* (2013.01); *H01L 29/66833* (2013.01); *H01L 29/792* (2013.01); *H01L 21/76897* (2013.01)

(58) Field of Classification Search
CPC ............. H01L 21/768; H01L 21/76805; H01L 21/76837; H01L 21/7682; H01L 21/76895; H01L 23/535; H01L 27/115; H01L 27/11563; H01L 27/11568; H01L 29/0649; H01L 29/66833; H01L 29/792
USPC ........................... 438/257–267; 257/314–321
See application file for complete search history.

(56) References Cited

U.S. PATENT DOCUMENTS

| | | | |
|---|---|---|---|
| 2008/0265365 A1* | 10/2008 | Frohberg ............ | H01L 21/7682 257/513 |
| 2009/0050955 A1* | 2/2009 | Akita .................... | H01L 27/115 257/324 |
| 2015/0262868 A1* | 9/2015 | Ting .................. | H01L 21/76837 257/288 |

FOREIGN PATENT DOCUMENTS

JP 2007-035728 A 2/2007

* cited by examiner

*Primary Examiner* — Brook Kebede
(74) *Attorney, Agent, or Firm* — McGinn I.P. Law Group, PLLC.

(57) ABSTRACT

When a void is caused in an interlayer insulating film on a semiconductor substrate, the invention prevents short circuit between two or more contact plugs that sandwich the void therebetween via a conductive film buried in the void at the time of formation of the contact plugs. An element isolation region having an upper surface lower than a main surface of the semiconductor substrate is formed inside a trench in the main surface of the semiconductor substrate, so that a void formed immediately above the semiconductor substrate in an active region and a void formed immediately above the element isolation region are divided from each other. In this manner, a conductive film is prevented from being buried in the second void.

20 Claims, 15 Drawing Sheets

FIG. 23

| | OPERATION METHOD WRITING/ERASING | WRITING OPERATION VOLTAGE(V) Vmg/Vs/Vcg/Vd/Vb | ERASING OPERATION VOLTAGE(V) Vmg/Vs/Vcg/Vd/Vb | READING OPERATION VOLTAGE(V) Vmg/Vs/Vcg/Vd/Vb |
|---|---|---|---|---|
| A | SSI(WRITING)/BTBT(ERASING) | 10/5/1/0.5/0 | -6/6/0/open/0 | 0/0/1.5/1.5/0 |
| B | SSI(WRITING)/FN(ERASING) | 10/5/1/0.5/0 | 12/0/0/0/0 | 0/0/1.5/1.5/0 |
| C | FN(WRITING)/BTBT(ERASING) | -12/0/0/0/0 | -6/6/0/open/0 | 0/0/1.5/1.5/0 |
| D | FN(WRITING)/FN(ERASING) | -12/0/0/0/0 | 12/0/0/0/0 | 0/0/1.5/1.5/0 |

SEMICONDUCTOR DEVICE AND METHOD OF MANUFACTURING THE SAME

CROSS-REFERENCE TO RELATED APPLICATION

The present application claims priority from Japanese Patent Application No. 2016-187772 filed on Sep. 27, 2016, the content of which is hereby incorporated by reference into this application.

TECHNICAL FIELD OF THE INVENTION

The present invention relates to a semiconductor device and a method of manufacturing the same, and can be preferably used for, for example, a semiconductor device including an element isolation region and a contact plug.

BACKGROUND OF THE INVENTION

As an electrically-writable/erasable non-volatile semiconductor storage device, an EEPROM (Electrically Erasable and Programmable Read Only Memory) has been widely used. Each of these storage devices represented by a flash memory that has been currently widely used has a conductive floating gate electrode or trap insulating film surrounded by an oxide film below a gate electrode of a MISFET, takes a charge storage state in the floating gate or the trap insulating film as storage information, and reads the storage information as a threshold of a transistor. This trap insulating film means a charge-storable insulating film, and a silicon nitride film or others is cited as one example. The threshold of the MISFET is shifted by injection and discharge of electric charges to and from such a charge storage region so that the MISFET is operated as a storage element. As this flash memory, a split-gate MONOS (Metal-Oxide-Nitride-Oxide Semiconductor) memory is cited.

When a plurality of memory cells are arranged on a semiconductor substrate and when different voltages are applied to electrodes of the respective memory cells, it is known that memory cells adjacent to each other are separated by an element isolation region formed of an insulating film buried in a trench in a main surface of a semiconductor substrate, and known that a contact plug penetrating through an interlayer insulating film on the semiconductor substrate is connected to a drain region of each memory cell.

For example, Patent Document 1 (Japanese Patent Application Laid-open Publication No. 2007-35728) describes that heights of an upper surface of the element isolation positioned between sidewall spacers adjacent to each other and an upper surface of other region of the element isolation are substantially equal to each other.

SUMMARY OF THE INVENTION

If a distance between patterns adjacent to each other is short on a substrate because of advance of microfabrication of a semiconductor device, voids may be formed in the interlayer insulating film between the adjacent patterns when an interlayer insulating film is formed on the substrate so as to cover the patterns. In such a case, if two or more contact holes penetrating through the interlayer insulating film are formed so as to sandwich the void, and then, a metal film is buried in these contact holes to form contact plugs, the metal film is buried also in the void in contact with each contact hole, and therefore, a short circuit occurs between two or more contact plugs.

Other object and novel characteristics will be apparent from the description of the present specification and the accompanying drawings.

The typical ones of the inventions disclosed in the present application will be briefly described as follows.

A semiconductor device according to an embodiment includes: two contact plugs penetrating through an interlayer insulating film on a semiconductor substrate; a first conductive film, a void, and a second conductive film sequentially lined between the two contact plugs in the interlayer insulating film in a plan view; and an element isolation region formed immediately below the void and having an upper surface positioned lower than a main surface of the semiconductor substrate, and the void is formed at a position lower than the first conductive film and the second conductive film.

A semiconductor device manufacturing method of another embodiment has a process of forming, in a trench in a main surface of a semiconductor substrate, an element isolation region having an upper surface lower in height than the main surface of the semiconductor substrate; a process of forming an interlayer insulating film including avoid on the semiconductor substrate and the element isolation region; and a process of opening, in the interlayer insulating film, two contact holes interposing the element isolation region and the void in a plan view and burying a connecting part in each of the contact holes.

According to an embodiment, the performance of the semiconductor device can be improved.

BRIEF DESCRIPTIONS OF THE DRAWINGS

FIG. 23 is a table showing an example of voltage application conditions of a selective memory cell of an embodiment of the present invention;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout all the drawings for describing the embodiments, and the repetitive description thereof will be omitted. Also, in the following embodiments, the description of the same or similar parts will not be repeated in principle unless otherwise particularly required.

<Regarding Structure of Semiconductor Device>

A level difference is provided between a main surface of a semiconductor substrate and an upper surface of an element isolation region in a semiconductor device of the present embodiment, so that occurrence of short circuit is prevented between contact plugs when voids are formed in an interlayer insulating film on the semiconductor substrate so as to fill the voids with a metal at the time of formation of the contact plugs. Here, a semiconductor device including a memory cell configuring a split-gate MONOS memory is described. However, an element formed on the semiconductor substrate is not limited to this, and may be, for example, a MISFET (Metal Insulator Semiconductor Field Effect Transistor) having a gate pattern on a substrate, a capacitive element having an electrode pattern on a substrate, or others.

Figure 1:
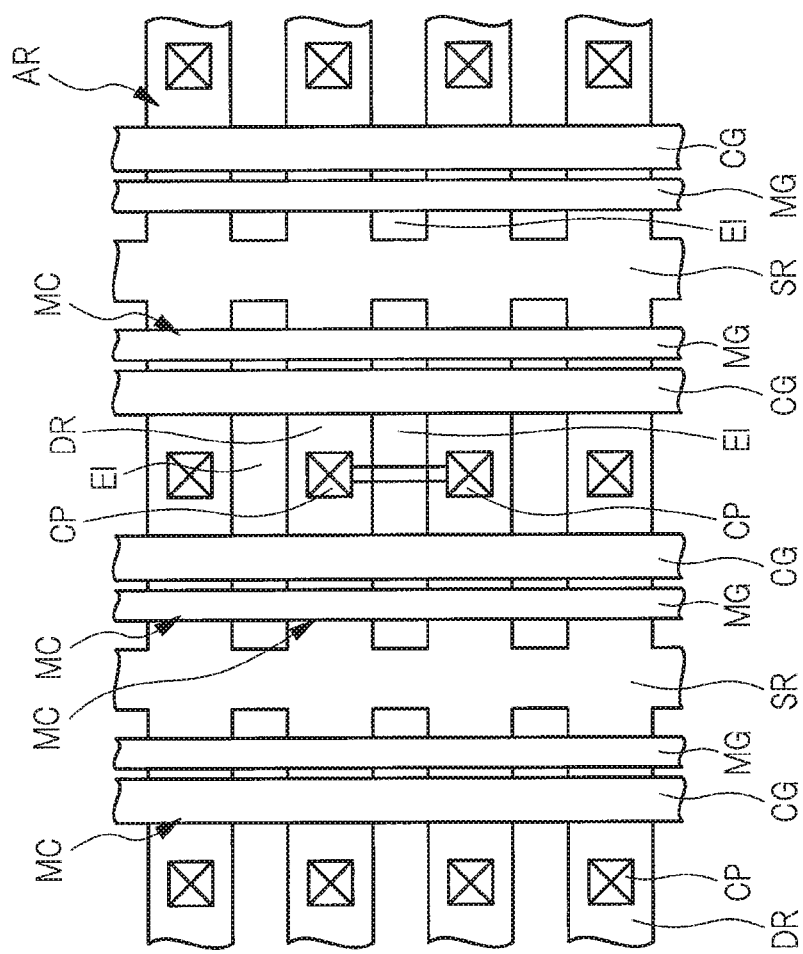
FIG. 1 is a plan view showing a semiconductor device according to an embodiment of the present invention.
Figure 2:
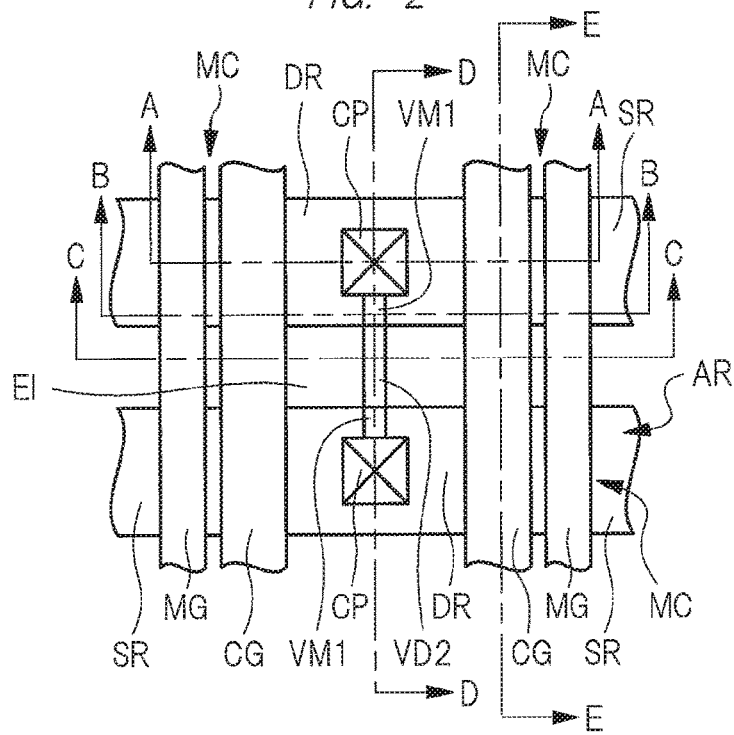
FIG. 2 is an enlarged plan view showing a part of FIG. 1.

In the following, the structure of the semiconductor device of the present embodiment is described with reference to FIG. 1 to FIG. 7. FIG. 1 is a plan view showing the semiconductor device of the present embodiment. FIG. 2 is an enlarged plan view showing a part of FIG. 1. FIG. 3 to FIG. 7 are cross-sectional views each showing the semiconductor device of the present embodiment. FIG. 3, FIG. 4, FIG. 5, FIG. 6, and FIG. 7 are cross-sectional views taken along a line A-A, a line B-B, a line C-C, a line D-D, and a line E-E of FIG. 2, respectively. In FIG. 1 and FIG. 2, illustrations of a gate insulating film, a sidewall, an interlayer insulating film, wirings, a silicide layer, and so forth are omitted.

As shown in FIG. 1 and FIG. 2, the semiconductor device of the present embodiment includes a semiconductor substrate having a main surface and a back surface opposite to the main surface. On a main surface side of the semiconductor substrate, an active region AR as the main surface of the semiconductor substrate is exposed from an element isolation region EI buried in a trench in the main surface of the semiconductor substrate. In other words, the active region AR is sectioned by the element isolation regions EI, and a plane shape of the active region AR is defined by the element isolation regions EI. The active region AR has a portion (hereinafter referred to as first extending portion) extending in an X direction along the main surface of the semiconductor substrate and a portion (hereinafter referred to as second extending portion) extending in a Y direction that is a direction along the main surface of the semiconductor substrate and that is orthogonal to the X direction. In the active region AR, a plurality of the first extending portions are arranged in the Y direction, and a plurality of the second extending portions are arranged in the X direction. That is, the active region AR has a lattice layout in a plan view.

On the main surface of the semiconductor substrate and on the element isolation region EI, control gate electrodes CG extending in the Y direction and memory gate electrodes MG extending in the Y direction are formed. On the semiconductor substrate, two control gate electrodes CG and two memory gate electrodes MG are alternately arranged. That is, one sidewall of a certain control gate electrode CG in the X direction faces the memory gate electrode MG, and the other sidewall thereof in the X direction faces another control gate electrode CG. One control gate electrode CG and one memory gate electrode MG are adjacent to each other via an insulating film (not illustrated) including a charge storage film, and cross the first extending portion in the active region AR in a plan view.

Between two second extending portions adjacent to each other in the X direction, two control gate electrodes CG and two memory gate electrodes MG cross the plurality of first extending portions. Also, between two second extending portions adjacent to each other in the X direction, the above-described two control gate electrodes CG adjacently face each other, and neither the memory gate electrode MG nor the second extending portion is formed between these two control gate electrodes CG in a plan view. Also, a drain region DR as an n-type semiconductor region is formed in each first extending portion between the above-described two control gate electrode CG, and a source region SR as an n-type semiconductor region is formed in the first extending portion opposite to the drain region DR across the control gate electrode CG and the memory gate electrode MG that are adjacent to each other.

In other words, one control gate electrode CG and one memory gate electrode MG are arranged on a first extending portion between the drain region DR and the source region SR formed so as to be separated from each other in the first extending portion. One memory cell MC of a MONOS memory is configured of paired source region SR and drain region DR formed on one first extending portion and one control gate electrode CG and one memory gate electrode MG positioned between the paired source region SR and drain region DR. An n-type semiconductor region is formed in the second extending portion, and the respective source regions SR of the plurality of memory cells MC are electrically connected to each other via the second extending portion.

In the first extending portion in the active region AR, the plurality of memory cells MC are formed side by side along the X direction. In each of the plurality of first extending portions arranged side by side along the Y direction, the memory cell MC having the control gate electrode CG and the memory gate electrode MG in common are formed. In one first extending portion between the second extending portions adjacent to each other in the X direction, two memory cells MC are arranged so as to be line symmetry across the drain region DR. That is, the memory cells MC adjacent to each other in the X direction between second extending portions adjacent to each other share the drain region DR.

The respective drain regions DR of the plurality of memory cells MC arranged side by side along the Y direction are arranged side by side along the Y direction. A contact plug CP penetrating through an interlayer insulating film IL (see FIG. 3) on the semiconductor substrate is connected to an upper surface of each drain region DR via a silicide layer S1 (see FIG. 3). That is, contact plugs CP connected to different first extending portions are arranged side by side along the Y direction. An element isolation region EI sandwiched between two first extending portions in the Y direction is formed immediately below a region between the contact plugs CP adjacent to each other in the Y direction.

Here, the contact plug CP has a width in the Y direction shorter than the width of the first extending portion in the active region AR in a short-side direction (Y direction). Also, the contact plug CP immediately above the first extending portion is separated from an end of the first extending portion in the Y direction. As shown in FIG. 2, a metal film (conductive film) VM1 that is connected to the contact plug CP and that is integrated with the contact plug CP is formed in an interlayer insulating film (not illustrated) between the contact plug CP and the element isolation region EI adjacent to each other in the Y direction in a plan view. The metal film VM1 is a pattern that is positioned immediately above the first extending portion in the active region AR and that extends in the Y direction in a plan view.

Also in a plan view, a void VD2 that is formed in the element isolation region and that extends in the Y direction is formed between two metal films VM1 formed between two contact plugs CP adjacent to each other in the Y direction. That is, in the Y direction, the contact plug CP, the metal film VM1, the void VD2, the metal film VM1, and the contact plug CP are sequentially formed. The void VD2 is positioned immediately above the element isolation region EI.

Figure 3:
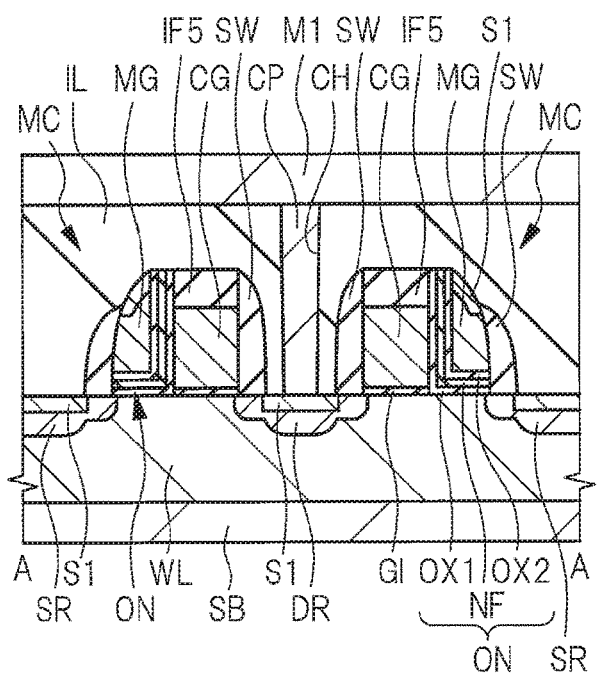
FIG. 3 is a cross-sectional view taken along a line A-A of FIG. 2.

As shown in FIG. 3, the semiconductor device of the present embodiment has a semiconductor substrate SB made of, for example, single crystal Si (silicon). On a main surface of the semiconductor substrate SB, a well WL is formed as a p-type semiconductor region reaching the middle of the depth of the semiconductor substrate SB in a depth. In the well WL, p-type impurities (for example, B (boron)) with relatively low concentration are introduced. FIG. 3 is a cross-sectional view along the extending direction of the first extending portion in the active region, and shows the first extending portion, the paired memory cells MC above the first extending portion, and the contact plug CP connected to the drain region DR of the memory cells MC.

On the main surface of the semiconductor substrate SB, a control gate electrode CG and an insulating film IF5 are sequentially formed via a gate insulating film GI. The gate insulating film GI is made of, for example, a silicon oxide film, and the control gate electrode CG is made of, for example, a polysilicon film. The insulating film IF5 is a cap insulating film made of, for example, a silicon nitride film, and extends in the Y direction as similar to the control gate electrode CG. A memory gate electrode MG is formed via an ONO (oxide-nitride-oxide) film ON on one sidewall of a stacked film (hereinafter referred to as a gate stack in some cases) formed of the gate insulating film GI, the control gate electrode CG, and the insulating film IF5. The ONO film ON is sandwiched also between a bottom surface of the memory gate electrode MG and the main surface of the semiconductor substrate SB.

The ONO film ON is contiguously formed between the gate stack and the memory gate electrode MG and between the memory gate electrode MG and the main surface of the semiconductor substrate SB. That is, the ONO film ON has an L-shaped cross-section. The ONO film ON is a stacked film formed of a silicon oxide film (top oxide film) OX1, a silicon nitride film NF, and a silicon oxide film (bottom oxide film) OX2 sequentially formed on the semiconductor substrate SB. That is, the ONO film ON is formed of the silicon oxide film OX1, the silicon nitride film NF, and the silicon oxide film OX2 sequentially formed from the control gate electrode CG toward the memory gate electrode MG. The silicon nitride film NF is a portion where electric charges are stored as storage information in the memory cell MC, that is, a charge storage film (charge storage portion, charge storage layer, or trap insulating film).

Each of sidewalls on both sides of a pattern including the gate stack, the memory gate electrode MG, and the ONO film ON is covered with a sidewall SW. The sidewall SW is formed of, for example, a silicon oxide film and a silicon nitride film sequentially formed on the semiconductor substrate SB. Also, a pair of the source region SR and the drain region DR is formed on an upper surface of the semiconductor substrate SB so as to sandwich the pattern in the X direction (a gate length direction of each of the memory gate electrode MG and the control gate electrode CG). The sidewall SW has a width of, for example, 50 nm, in the X direction.

Each of the source region SR and the drain region DR is an n-type semiconductor region formed by introducing n-type impurities (for example, P (phosphorus) or As (arsenic)) to the main surface of the semiconductor substrate SB. Each of the source region SR and the drain region DR is configured of an extension region with relatively low n-type impurity concentration and a diffusion region with n-type impurity concentration higher than that of the extension region. In the drawing, a boundary between the extension region and the diffusion region is not illustrated, and an integrated structure is illustrated. The extension region has a formation depth shallower than that of the diffusion region, and is positioned in a region closer to the main surface of the semiconductor substrate SB immediately below the control gate electrode CG and the memory gate electrode MG than the diffusion region. The source region SR and the drain region DR each have a formation depth shallower than the formation depth of the well WL.

The silicide layer S1 is formed on an upper surface of each of the gate stack, the memory gate electrode MG, the ONO film ON, and the source region SR and the drain region DR exposed from the sidewall SW. The silicide layer S1 is formed also on an upper surface of the memory gate electrode MG exposed from the sidewall SW. The silicide layer S1 is made of, for example, NiSi (nickel silicide) or CoSi (cobalt silicide), and has a function of reducing connection resistance between the contact plug CP and each of the memory gate electrode MG, the source region SR, and the drain region DR.

The pair of the source region SR and the drain region DR, the control gate electrode CG, the memory gate electrode MG, and the ONO film ON configure one memory cell MC. FIG. 3 shows a structure in which two facing memory cells MC share the drain region DR. The memory cell MC is configured of two transistors (MISFETs, field-effect transistors), that is, a control transistor and a memory transistor. The control gate electrode CG and the pair of the source region SR and the drain region DR configure the control transistor, and the memory gate electrode MG and the pair of the source region SR and the drain region DR configure the memory transistor. That is, the control transistor and the memory transistor configuring one memory cell MC share the source and drain regions. The ONO film ON functions as a gate insulating film of the memory transistor including the memory gate electrode MG.

The interlayer insulating film IL is formed on each of the main surface of the semiconductor substrate SB, the gate stack, the ONO film ON, the memory gate electrode MG, and the sidewall SW so as to cover the memory cell MC. An upper surface of the interlayer insulating film IL is flattened. The interlayer insulating film IL is mainly made of a silicon oxide film. Note that the interlayer insulating film IL is formed of a thin liner film formed on the main surface of the semiconductor substrate SB and a thick silicon oxide film formed on the liner film although not illustrated. The liner film (not illustrated) is formed of, for example, a silicon nitride film, and functions as an etching stopper film when a contact hole described later is opened. A height from the main surface of the semiconductor substrate SB to an upper surface of the interlayer insulating film IL, that is, a film thickness of the interlayer insulating film IL, is, for example, 220 nm.

A contact hole (connection hole) CH penetrating through the interlayer insulating film IL is formed immediately above the drain region DR. In the contact hole CH, the contact plug (connecting part) CP is buried. An upper surface of the contact plug CP is flattened on the substantially same plane of the upper surface of the interlayer insulating film IL, and a lower surface of the contact plug CP is connected to the drain region DR via the silicide layer S1. The contact plug CP is a columnar conductive film (metal film) extending in a direction (height direction, Z direction) perpendicular to the main surface of the semiconductor substrate SB, and is formed from the upper surface to the lower surface of the interlayer insulating film IL. That is, the contact plug CP penetrates through the interlayer insulating film IL. The contact plug CP and the interlayer insulating film IL configure a contact layer of the semiconductor device of the present embodiment. A height from the lower surface to the upper surface of the contact plug is, for example, 220 nm.

The contact plug CP is formed of a thin barrier conductive film covering a bottom surface and a sidewall of the contact hole CH and a main conductive film formed in the contact hole CH via the barrier conductive film. The barrier conductive film is made of, for example, a TiN (titanium nitride) film or others, and the main conductive film is made of, for example, a W (tungsten) film or others. The material of the barrier conductive film is not limited to TiN, and Ti (titanium), Ta (tantalum), TaN (tantalum nitride), or others may be used.

In a region not illustrated, a contact plug CP which supplies a common voltage to each source region SR of a plurality of memory cells MC formed on the semiconductor substrate SB is connected to the upper surface of the source region SR via the silicide layer S1. Also in a region not illustrated, a contact plug CP connected to the upper surface of the memory gate electrode MG via the silicide layer S1 is formed. Furthermore, in a power supply portion to the control gate electrode CG although not illustrated, a silicide layer S1 is formed on the upper surface of the control gate electrode CG exposed from the insulating film IF5, and a contact plug CP is connected onto the silicide layer S1.

The contact plug CP is formed between the paired control gate electrodes CG adjacent to each other in the X direction. The memory gate electrode MG is formed so as to be adjacent to a sidewall of the control gate electrode CG opposite to a sidewall of the same facing the contact plug CP.

On the interlayer insulating film IL and the contact plug CP, a wiring M1 mainly made of, for example, a Cu (copper) film, is formed. The wiring M1 is electrically connected to the drain region DR via the contact plug CP and the silicide layer S1. The wiring M1 has a function of a bit line, and extends in the X direction as similar to the first extending portion in the active region. Although not illustrated here, the wiring M1 is formed in a trench penetrating through another interlayer insulating film formed on the interlayer insulating film IL. Also, on a first wiring layer including the wiring M1, a plurality of wiring layers not illustrated are stacked.

Figure 4:
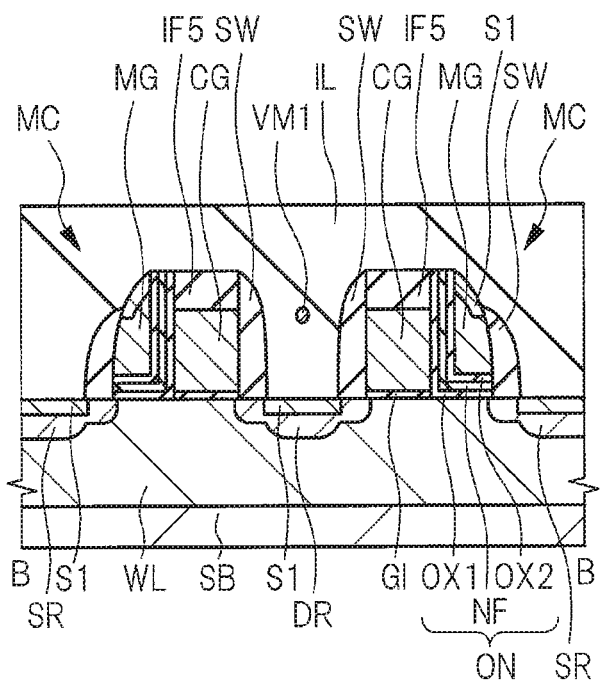
FIG. 4 is a cross-sectional view taken along a line B-B of FIG. 2.

FIG. 4 shows a cross section along the X direction, the cross section including the metal film VM1 shown in FIG. 1. That is, in a plan view, FIG. 4 is a cross-sectional view of a region between the contact plug CP and the element isolation region EI shown in FIG. 1, the cross section being along the X direction. As shown in FIG. 4, the structure of the memory cell MC is similar to that of FIG. 3. However, FIG. 4 does not show the contact plug CP but shows the metal film VM1 integrated with the contact plug CP.

The metal film VM1 is formed in the interlayer insulating film IL at a position sandwiched by gate stacks configuring two memory cells MC adjacent to each other in the X direction (gate length direction). That is, the metal film VM1 is formed between the sidewalls SW covering the sidewalls of two control gate electrodes CG adjacent to and facing each other in the X direction, and the periphery of the metal film VM1 is covered with the interlayer insulating film IL. The height of each gate stack, that is, a distance from the main surface of the semiconductor substrate SB to the upper surface of the insulating film IF5 in a direction perpendicular to the main surface of the semiconductor substrate SB, is, for example, 150 nm. A distance between the control gate electrodes CG adjacent to each other in the X direction is, for example, 200 nm. Also, a distance between the sidewalls SW facing each other between the control gate electrodes CG adjacent to each other in the X direction is, for example, 100 nm.

Figure 6:
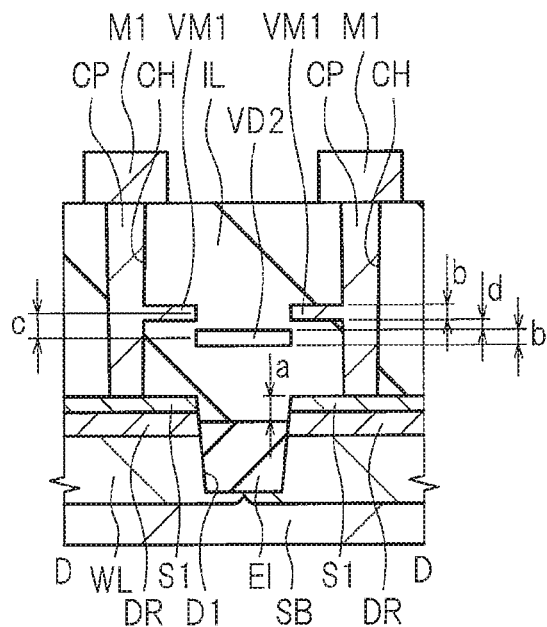
FIG. 6 is a cross-sectional view taken along a line D-D of FIG. 2.

FIG. 6 shows a cross section including the contact plug CP, the element isolation region EI, the metal film VM1, and the void VD2 shown in FIG. 1, the cross section being along the Y direction. As shown in FIG. 6, the metal film VM1 is structured to protrude from the sidewall of the contact plug CP in a direction along the main surface of the semiconductor substrate SB, and is integrated with the contact plug CP. That is, the metal film VM1 is connected to the contact plug CP, and formed of the same metal film as that of the contact plug CP. However, there are a case of the metal film VM1 formed of only the barrier conductive film and a case of the metal film VM1 formed of the barrier conductive film and the main conductive film.

The metal film VM1 is formed of a connecting member buried in avoid formed in the element isolation region EI when the contact plug CP is formed. The metal film VM1 is connected to each of the respective facing sidewalls of two contact plugs CP. However, the metal film VM1 connected to one contact plug CP and the metal film VM1 connected to the other contact plug CP are separated from each other.

The element isolation region EI is buried in a trench D1 formed in the main surface of the semiconductor substrate SB, but does not completely fill the trench D1. That is, the trench D1 is completely filled with the element isolation region EI covering the bottom surface of the trench D1 and filling most of the trench D1 and with the interlayer insulating film IL formed on the element isolation region EI. In other words, the element isolation region EI and the interlayer insulating film IL on the element isolation region EI are formed in the trench D1. The element isolation region EI has a STI (Shallow Trench Isolation) structure.

Figure 5:
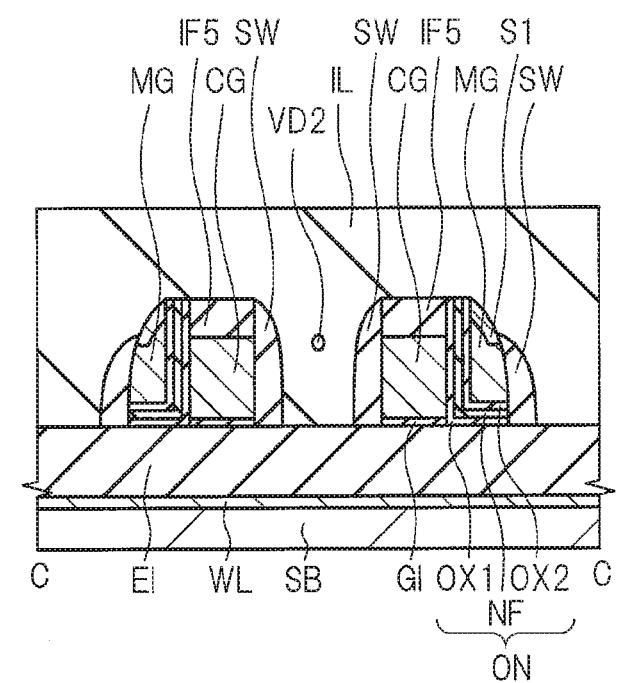
FIG. 5 is a cross-sectional view taken along a line C-C of FIG. 2.

FIG. 5 shows a cross section including the element isolation region EI and the void VD2 shown in FIG. 1, the cross section being along the X direction. That is, FIG. 5 is a cross-sectional view of a region between two first extending portions shown in FIG. 1 along the X direction in a plan view. As shown in FIG. 5 and FIG. 6, the element isolation region EI buried in the trench formed in the main surface of the semiconductor substrate SB is formed on the semiconductor substrate SB. As shown in FIG. 5, the gate stack, the ONO film ON, and the memory gate electrode MG configuring a memory cell, and the sidewalls SW are formed on the element isolation region EI.

Here, the void VD2 is formed in the interlayer insulating film IL at a position sandwiched between two gate stacks adjacent to each other in the X direction. That is, the void VD2 is formed between the sidewalls SW covering the respective sidewalls of two control gate electrodes CG adjacent to and facing each other in the X direction. That is, the periphery of the void VD2 is covered with the interlayer insulating film IL. As shown in FIG. 6, while the metal film VM1 is not completely covered with the interlayer insulating film IL and is partially connected to the contact plug CP, the void VD2 is completely covered with the interlayer insulating film IL and contacts with neither the metal film VM1 nor the contact plug CP.

As shown in FIG. 4 and FIG. 5, each of the metal film VM1 and the void VD2 has, for example, an oval cross-sectional surface along the X direction and the Z direction. Also, each of the metal film VM1 and the void VD2 extends in the Y direction. That is, each of the metal film VM1 and the void VD2 has a columnar three-dimensional shape.

As shown in FIG. 6, the metal films VM1 each connected to the respective contact plugs CP are formed side by side in the Y direction between the contact plugs CP adjacent to each other in the Y direction, and these metal films VM1 separated from each other are positioned at a substantially equal height to each other. That is, the shortest distance (height) between the main surface of the semiconductor substrate SB and the metal film VM1 connected to one of the contact plugs CP adjacent to each other is substantially equal to the shortest distance (height) between the main surface of the semiconductor substrate SB and the metal film VM1 connected to the other contact plug CP. Note that the height in the present application means a distance or a position in a direction perpendicular to the main surface of the semiconductor substrate SB. In the following, a direction perpendicular to the main surface of the semiconductor substrate SB may be referred to as a height direction.

Also, the shortest distance (height) between the metal film VM1 and the main surface of the semiconductor substrate SB is substantially equal to the shortest distance (height) between the void VD2 and the upper surface of the element isolation region EI immediately below the void VD2. However, in the present embodiment, since the position of the upper surface of the element isolation region EI is lower than the main surface of the semiconductor substrate SB, the formation position of the void VD2 is lower than the formation position of the metal film VM1.

For example, when the height from the main surface of the semiconductor substrate SB to the upper surface of the interlayer insulating film IL in the active region is about 220 nm, the height from the main surface of the semiconductor substrate SB to the bottom surface of the metal film VM1 in the active region in the height direction is about 60 nm, and the height from the upper surface of the metal film VM1 to the upper surface of the interlayer insulating film IL is about 110 nm. In this case, the height from the upper surface of the element isolation region EI to the bottom surface of the void VD2 in the height direction is about 60 nm, and the height from the upper surface of the void VD2 to the upper surface of the interlayer insulating film IL is about 160 nm.

Here, respective thicknesses (distances) "b" of the metal film VM1 and the void VD2 in the height direction are substantially equal to each other, and the thickness "b" is, for example, 50 nm. Also, a distance "a" between the main surface of the semiconductor substrate SB and the upper surface of the element isolation region EI in the height direction is larger than 50 nm. That is, an expression of "a>b" is established. Therefore, in the height direction, the bottom surface of the metal film VM1 and the void VD2 are separated from each other. That is, in the height direction, a distance "c" between a midpoint between the upper surface and the lower surface of the metal film VM1 and a midpoint between the upper surface and the lower surface of the void VD2 is equal to the distance "a", the distance "c" is equal to or larger than 50 nm. That is, an expression of "a=c" is established. Note that a distance between the lower surface of the metal film VM1 and the lower surface of the void VD2 in the height direction is equal to the distance "c".

Thus, a distance "d" between the metal film VM1 and the void VD2 in the height direction can be obtained by subtracting the thickness (distance) "b" from the distance "a". In other words, an expression of "d=c−b=a−b=d>0" is established. Note that the distance "a" indicates a recessed amount of the upper surface of the element isolation region EI from the main surface of the semiconductor substrate SB. Also, the distance "a" indicates a size of a level difference between the main surface of the semiconductor substrate SB and the upper surface of the element isolation region EI.

Note that a case in which the thickness of the metal film VM1 and the thickness of the void VD2 are equal to each other has been described. However, the thickness of the metal film VM1 and the thickness of the void VD2 may be different from each other. Also in this case, each of the distance "a" and the distance "c" is larger than the thickness of the metal film VM1 and the thickness of the void VD2.

When the height from the main surface of the semiconductor substrate SB to the upper surface of the interlayer insulating film IL in the active region is 220 nm, the distance from the upper surface of the element isolation region EI to the upper surface of the interlayer insulating film IL is equal to or larger than 250 nm since the distance "a" is equal to or larger than 50 nm.

A main feature of the present embodiment is to prevent continuous extension of a void in one direction by forming the upper surface of the element isolation region EI to be lower than the main surface of the semiconductor substrate SB to cut the void on a boundary between the element isolation region EI and the main surface of the semiconductor substrate SB when the void is formed between patterns adjacent to each other on the semiconductor substrate SB. As described further below, this manner can prevent a short circuit between the contact plugs CP via the metal film buried in the void.

Figure 7:
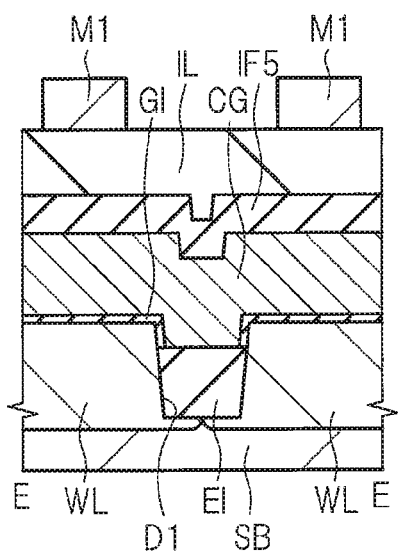
FIG. 7 is a cross-sectional view taken along a line E-E of FIG. 2.

FIG. 7 shows such a cross section of the gate stack including the control gate electrode CG shown in FIG. 1, the cross section being along the Y direction, as being along the extending direction (gate width direction) of the control gate electrode CG. As shown in FIG. 7, apart of the gate stack is positioned immediately above the first extending portion of the active region AR (see FIG. 1), and another part of the gate stack is positioned immediately above the element isolation region EI. That is, the control gate electrode CG extends over the element isolation region EI and the active region.

In the present embodiment, since the upper surface of the element isolation region EI is lower than the main surface of the semiconductor substrate SB, the position of the upper surface of the control gate electrode CG immediately above the element isolation region EI is lower than the position of the upper surface of the control gate electrode CG immediately above the main surface of the semiconductor substrate SB in the active region AR adjacent to the element isolation region EI.

<Regarding Operation of Non-Volatile Memory>

Next, an example of operation of a non-volatile memory is described with reference to FIG. 23.

The memory cell of the present embodiment has a MISFET structure, takes a charge storage state in a trap insulating film below the gate electrode of the MISFET as storage information, and reads the storage information as a threshold of the transistor. The trap insulating film is an insulating film where electric charges can be stored, and a silicon nitride film or others is cited as one example. By injection and discharge of the electric charges to and from such a charge storage region, the threshold of the MISFET is shifted for operation as the storage element. As a non-volatile semiconductor storage device using the trap insulating film, a split-gate MONOS memory such as the memory cell of the present embodiment is cited.

FIG. 23 is a table showing an example of conditions of voltage application to each portion of a selective memory cell at the time of "write", "erase", and "read" of the present embodiment. the table of FIG. 23 shows a voltage Vmg to be applied to the memory gate electrode MG of the memory cell MC as shown in FIG. 3, a voltage Vs to be applied to the source region SR thereof, a voltage Vcg to be applied to the control gate electrode CG thereof, a voltage Vd to be applied to the drain region DR thereof, and a base voltage Vb to be applied to the well WL of the upper surface of the semiconductor substrate SB at the time of each of "write", "erase", and "read". The selective memory cell described here means a memory cell selected as a target for "write", "erase", or "read".

Note that items shown in the table of FIG. 23 are one preferable example of the conditions of the voltage application, and the conditions are not limited to the example and can be variously changed as required. Also, the present embodiment defines that injection of electron to the silicon nitride film NF (see FIG. 3) which is a charge storage part in the ONO film ON of the memory transistor is "write", and injection of hole is "erase".

In the table of FIG. 23, an "A" row corresponds to a case in which the write method is of an SSI scheme and the erase method is of a BTBT scheme, a "B" row corresponds to a case in which the write method is of the SSI scheme and the erase method is of an FN scheme, a "C" row corresponds to a case in which the write method is of the FN scheme and the erase method is of the BTBT scheme, and a "D" row corresponds to a case in which the write method is of the FN scheme and the erase method is of the FN scheme.

The SSI scheme can be regarded as an operating method of writing information into a memory cell by injecting hot electrons into the silicon nitride film NF. The BTBT scheme can be regarded as an operating method of erasing information in the memory cell by injecting hot holes into the silicon nitride film NF. The FN scheme can be regarded as an operating method of writing or erasing by electron or hole tunneling. Regarding the FN scheme, in another representation, the writing in the FN scheme can be regarded as an operating scheme of writing information into the memory cell by injecting electrons into the silicon nitride film FN by FN tunnel effect, and the erasing in the FN scheme can be regarded as an operating scheme of erasing information in the memory cell by injecting holes into the silicon nitride film NF by FN tunnel effect. Specific description is made below.

The write schemes include a write scheme (hot electron injection write scheme) of writing by hot electron injection based on source side injection referred to as a so-called SSI (Source Side Injection) scheme and a write scheme (tunneling write scheme) of writing by FN (Fowler Nordheim) tunneling referred to as a so-called FN scheme.

In the SSI scheme writing, the writing is performed by applying, for example, voltages (Vmg=10 V, Vs=5 V, Vcg=1 V, Vd=0.5 V, and Vb=0 V) as shown in the item "write operation voltage" in the A row or the B row in the table of FIG. 23 to each part of the selective memory cell to which the writing is to be performed so that electrons are injected into the silicon nitride film NF in the ONO film ON of the selective memory cell.

At this time, the hot electrons are caused in a channel region (between the source and the drain) below a portion between two gate electrodes (the memory gate electrode MG and the control gate electrode CG of FIG. 3), and the hot electros are injected into the silicon nitride film NF as a charge storage part in the ONO film ON below the memory gate electrode MG. The injected hot electrons (electrons) are captured at a trap level in the silicon nitride film NF in the ONO film ON. As a result, a threshold voltage of the memory transistor increases. That is, the memory transistor becomes in a write state.

In the FN scheme writing, the writing is performed by applying, for example, voltages (Vmg=−12 V, Vs=0 V, Vcg=0 V, Vd=0 V, and Vb=0 V) as shown in the item "write operation voltage" in the C row or the D row in the table of FIG. 23 to each part of the selective memory cell to which the writing is to be performed so that the electrons are tunneled from the memory gate electron MG in the selective memory cell to be injected into the silicon nitride film NF in the ONO film ON. At this time, the electrons are tunneled by FN tunneling (FN tunnel effect) from the memory gate electrode MG through the silicon oxide film OX2 (see FIG. 3) to be injected into the ONO film ON, and are captured at the trap level in the silicon nitride film NF in the ONO film ON. As a result, the threshold voltage of the memory transistor increases. That is, the memory transistor becomes in a write state.

In the FN scheme writing, note that the writing can be performed also by causing the electrons to tunnel from the semiconductor substrate SB to be injected into the silicon nitride film NF in the ONO film ON. In this case, for example, write operation voltages obtained by reversing the positive and the negative of the "write operation voltage" in the C row or the D row in the table of FIG. 23 can be used.

The erase schemes include an erase scheme (hot hole injection erase scheme) of erasing by hot hole injection based on BTBT (Band-To-Band Tunneling) referred to as a so-called BTBT scheme and an erase scheme (tunneling erase scheme) of erasing by FN (Fowler Nordheim) tunneling referred to as a so-called FN scheme.

In the SSI scheme erasing, the erasing is performed by injecting holes caused by BTBT into the charge storage part (the silicon nitride film NF in the ONO film ON). For example, voltages (Vmg=−6 V, Vs=6 V, Vcg=0 V, Vd=open, and Vb=0 V) as shown in the item "erase operation voltage" in the A row or the C row in the table of FIG. 23 to each part of the selective memory cell to which the erasing is to be performed. In this manner, holes are caused by the BTBT phenomenon to accelerate an electric field acceleration, so that the holes are injected into the silicon nitride film NF in the ONO film ON of the selective memory cell. Therefore, the threshold voltage of the memory transistor decreases. That is, the memory transistor becomes in an erase state.

In the FN scheme erasing, the erasing is performed by applying, for example, voltages (Vmg=12 V, Vs=0 V, Vcg=0 V, Vd=0 V, and Vb=0 V) as shown in the item "erase operation voltage" in the B row or the D row in the table of FIG. 23 to each part of the selective memory cell to which the erasing is to be performed so that holes tunnel from the memory gate electrode MG and are injected into the silicon nitride film NF in the ONO film ON of the selective memory cell. Here, by the FN tunneling (FN tunnel effect), the holes tunnel from the memory gate electrode MG through the silicon oxide film OX2 (see FIG. 3) and are injected into the ONO film ON, and are captured at the trap level in the silicon nitride film NF in the ONO film ON. As a result, the threshold voltage of the memory transistor decreases. That is, the memory transistor becomes in an erase state.

In the FN scheme erasing, note that erasing can be performed also by causing the holes to tunnel from the semiconductor substrate SB and injecting the holes into the silicon nitride film NF in the ONO film ON. In this case, erase operation voltages can be obtained by, for example, reversing the positive and negative voltages in the term "erase operation voltages" in the B row or the D row in the table of FIG. 23.

In the reading, for example, voltages as shown in the item "read operation voltage" in the A row, the B row, the C row or the D row in the table of FIG. 23 are applied to each part of the selective memory cell to which the reading is to be performed. The write state and the erase state can be distinguished from each other by setting the voltage Vmg to be applied to the memory gate electrode MG in the reading so as to have a value between the threshold voltage of the memory transistor in the write state and the threshold voltage thereof in the erase state.

<Regarding Effect of Semiconductor Device>

Figure 26:
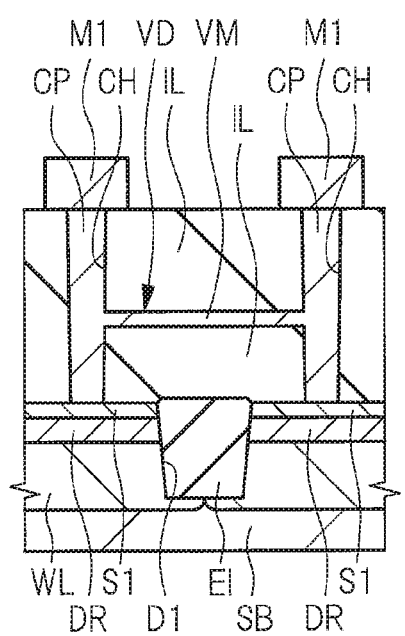
FIG. 26 is a cross-sectional view showing a process of manufacturing a semiconductor device of a comparative example.

In the following, effects of the semiconductor device of the present embodiment will be described by using FIG. 26 showing a comparative example. FIG. 26 is a cross-sectional view showing a semiconductor device of the comparative example. FIG. 26 is a cross-sectional view at a position corresponding to that of FIG. 6.

A pattern made of a gate electrode and others is formed on a semiconductor substrate. When a space between these patterns is filled with an interlayer insulating film, there is a method of depositing an insulating film on the semiconductor substrate by using a coating method, a CVD (Chemical Vapor Deposition) method, or others, to form an interlayer insulating film formed of the insulating film. On the other hand, with advance of microfabrication of semiconductor devices in recent years, the space between the patterns formed on the semiconductor substrate tends to be reduced, and therefore, it becomes difficult to completely fill the space between the patterns with the insulating film by the above-described method. As a result, if the insulating film is formed under conditions with low filling capability, voids are caused in the interlayer insulating film between the patterns adjacent to each other.

When two patterns each extending in the first direction are adjacent to each other in a second direction, such voids are formed so as to extend in the first direction. Here, it can be thought that a plurality of contact holes are formed side by side in the first direction between these two patterns and that a contact plug is formed inside each of the plurality of these contact holes. Here, each of the plurality of contact holes is connected to one void extending in the first direction. Therefore, two adjacent contact holes are connected to each other via the void.

Then, the contact plug is formed in each contact hole. Therefore, if a metal film is formed by the CVD method, the metal film (for example, a barrier conductive film and a main conductive film) is buried into not only the contact hole but the void. This causes a problem of short circuit between the two contact plugs, that are to be insulated from each other, via the metal film buried in the void in the interlayer insulating film. That is, a structure as shown in FIG. 26 is caused. This phenomenon of connection between the contact plugs CP via a conductive film VM buried in a void VD may be referred to as piping.

As shown in FIG. 26, on a main surface of a semiconductor substrate SB, drain regions DR configuring memory cells that are different from each other are formed side by side in a Y direction (first direction) so as to sandwich an element isolation region EI. Immediately above each drain region DR, a contact plug CP penetrating through an interlayer insulating film IL is formed. A silicide layer S1 is formed between the contact plug CP and the drain region DR, and a wiring M1 is formed on the contact plug CP.

In the interlayer insulating film IL, the void VD extending in the Y direction is formed. In the void VD, the metal film VM is buried. The void VD and the metal film VM are connected to the respective contact plugs CP formed immediately above the drain regions DR different from each other.

The height of the main surface of the semiconductor substrate SB and the height of the upper surface of the element isolation region EI are substantially equal to each other. Even if there is a difference in the height between the main surface of the semiconductor substrate SB and the upper surface of the element isolation region EI, this difference in the height is smaller than a thickness from a lower surface to an upper surface of the void VD in the height direction, that is, a thickness from a lower surface to an upper surface of the metal film VM in the height direction.

Here, one end of one metal film VM is connected to the contact plug CP connected to a first memory cell, and the other end of the metal film VM is connected to the contact plug CP connected to a second memory cell. This causes a short circuit between the contact plugs CP so that the different drain regions DR are at the same potential, which results in a problem of malfunction operation of the plurality of memory cells.

In order to prevent such a problem, it can be thought that the space between patterns such as gate electrodes formed on the semiconductor substrate is expanded so as not to cause the void. However, in this case, the microfabrication of the semiconductor device is difficult, which results in reduction of a performance of the semiconductor device. Moreover, it can be thought that the occurrence of the void can be prevented by decreasing the height of the gate electrode formed on the semiconductor substrate. However, this case causes a problem of increase of the resistance value of the gate electrode and a problem of reduction of a function of the gate electrode as an injection inhibiting film in an ion injection process into the semiconductor substrate.

Furthermore, in a split-gate MONOS memory cell, it is desirable to form sidewalls on both sides of the memory gate electrode in the gate length direction to be perpendicular to the main surface of the semiconductor substrate for the purpose of suppressing variations in a performance of the memory transistor and the purposes of decreasing the resistance of the memory gate electrode and improving a performance of connection with the contact plug by reliably forming the silicide layer on the upper surface of the memory gate electrode.

Perpendicularity of the memory gate electrode depends on the height of the gate stack including a control gate electrode adjacent to the memory gate electrode. That is, the memory gate electrode is a conductive film formed into a sidewall shape on the sidewall of the gate stack including the control gate electrode, and therefore, if the gate stack is high, an angle of the sidewall of the memory gate electrode is nearly perpendicular.

It can be thought that a space between memory cells adjacent to each other is reduced by the microfabrication of the semiconductor device. However, simple microfabrication of the memory cell degrades perpendicularly of the memory gate electrode. Therefore, in order to reduce a dimension of the memory cell while keeping the perpendicularity of the memory gate electrode, it is required to keep the height of the gate stack including the control gate electrode at a certain magnitude or larger, regardless of the space between control gate electrodes adjacent to each other.

That is, a case in which the height of each of these patterns is hardly reduced by the microfabrication of the semiconductor device in spite of the reduction of the space between the adjacent patterns is thought. In such a case, filling capability of the insulating film between these patterns is degraded. Thus, a void between patterns tends to occur, and the above-described short circuit tends to occur. In this manner, in some cases, it is difficult to prevent the occurrence of the short circuit by suppressing the occurrence of the void by contriving the height of the pattern formed on the semiconductor substrate, the space between patterns, or others.

On the other hand, in the semiconductor device of the present embodiment, the upper surface of the element isolation region EI is recessed to a back surface direction opposite to the main surface of the semiconductor substrate SB, and the upper surface of the element isolation region EI is positioned at a location lower than the main surface of the semiconductor substrate SB. Accordingly, as shown in FIG. 3 to FIG. 5 and FIG. 7, formation positions of the gate stack including the control gate electrode CG, the memory gate electrode MG, and the sidewalls SW immediately above the element isolation region EI are lower than formation positions of the gate stack, the memory gate electrode MG, and the sidewalls SW immediately above the semiconductor substrate SB in the active region adjacent to the element isolation region EI.

Thus, in the height direction, a distance between the upper surface of the control gate electrode CG and the upper surface of the interlayer insulating film IL on the element isolation region EI is larger than a distance between the upper surface of the control gate electrode CG and the upper surface of the interlayer insulating film IL on the active region. Similarly, a distance between the upper surface of the insulating film IF5 and the upper surface of the interlayer insulating film IL on the element isolation region EI is larger than a distance between the upper surface of the insulating film IF5 and the upper surface of the interlayer insulating film IL on the active region.

If filling capability of the interlayer insulating film IL between patterns adjacent to each other on the semiconductor substrate SB is poor, the formation position of the void caused between the patterns varies depending on formation positions of these patterns and a position of a ground of the interlayer insulating film IL. That is, in the present embodiment, the formation position of the pattern such as the gate stack formed immediately above the element isolation region EI is made lower than the active region by suppressing the height of the upper surface of the element isolation region EI to be low, so that the formation position of the void VD2 caused between the gate stacks adjacent to each other immediately above the element isolation region EI is made lower than the formation position of the void caused in the active region.

Here, as shown in FIG. 6, the distance "a" indicating a recessed amount of the upper surface of the element isolation region EI from the main surface of the semiconductor substrate SB is larger than the thickness (distance) "b" of each of the metal film VM1 and the void VD2. Therefore, the void extending along the gate stack including the control gate electrode is divided on a boundary between the element isolation region EI and the active region. That is, the void VD2 is formed at a height different from that of a void filled with the metal film VM1, and is not connected to the void filled with the metal film VM1.

Thus, even if a metal film is buried in the contact hole CH and in the void connected to the contact hole CH by the CVD method to form the contact plug CP and the metal film VM1 in order to form the contact plug CP in the contact hole CH, the metal film is not buried in the void VD2. Therefore, by dividing the void between the contact plugs CP adjacent to each other and forming the void VD2 not filled with the metal film, the short circuit between the contact plugs CP can be prevented. Therefore, this manner can improve reliability of the semiconductor device. Also, since microfabrication of an element group is not prevented because the occurrence of the void is prevented, the microfabrication of the semiconductor device can be achieved, so that the performance of the semiconductor device can be improved.

<Regarding Method of Manufacturing Semiconductor Device>

Next, a method of manufacturing the semiconductor device of the present embodiment will be described by using FIG. 8 to FIG. 22. Each of FIG. 8 to FIG. 22 is a cross-sectional view showing a process of manufacturing the semiconductor device of the present embodiment. In FIG. 8 to FIG. 12, note that a location where an element isolation region is to be formed between two active regions is shown in a cross section along an extending direction of a gate electrode to be formed. In FIG. 13 to FIG. 22, a cross section of the location described by using FIG. 8 to FIG. 12 is shown on right in the drawing, and a cross section along a short direction (gate length direction) of the gate electrode to be formed is shown on left in the drawing. An active region shown in each of FIG. 8 to FIG. 12 and the cross sections on right of FIG. 13 to FIG. 22 is a region where the drain region of the memory cell is to be formed but not a region where the gate electrode is to be formed.

Figure 8:
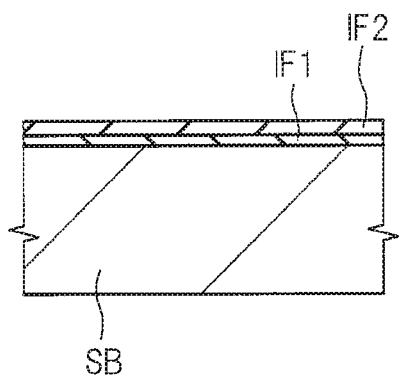
FIG. 8 is a cross-sectional view showing a process of manufacturing a semiconductor device according to an embodiment of the present invention.

In the process of manufacturing the semiconductor device, as shown in FIG. 8, a semiconductor substrate (semiconductor wafer) SB made of p-type single crystal Si (silicon) with a resistivity of, for example, 1 to 10 Ωcm, is prepared first. Subsequently, an insulating film IF1 made of a silicon oxide film is formed on an entire main surface of the semiconductor substrate SB by, for example, performing a heat treatment. Then, on the insulating film IF1, an insulating film IF2 made of, for example, a silicon nitride film, is formed by, for example, using the CVD method.

Figure 9:
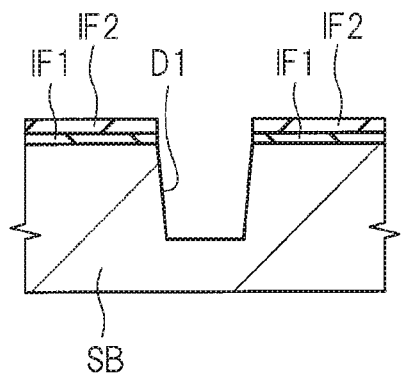
FIG. 9 is a cross-sectional view showing the process of manufacturing the semiconductor device, continued from FIG. 8.

Next, as shown in FIG. 9, by using a photolithography technique and a dry etching method, the insulating films IF2 and the IF1 and a part of the upper surface of the semiconductor substrate SB are removed. That is, openings penetrating through a plurality of positions of the stacked film formed of the insulating films IF2 and IF1 are formed, and a part of the upper surface of the semiconductor substrate SB immediately below these openings are removed. In this manner, trenches (concave parts or dent parts) D1 are formed in the upper surface of the semiconductor substrate SB. Each trench D1 reaches down to a depth in the middle of the semiconductor substrate SB. Although not illustrated, the plurality of trenches D1 are formed in the main surface of the semiconductor substrate SB here.

Note that each of the insulating films IF2 and IF1 and the semiconductor substrate SB is processed by an etching process once here. However, for example, the upper surface of the semiconductor substrate SB may be exposed by processing the insulating film IF2 by the dry etching method, and then, processing the insulating film IF1 by a wet etching method, and then, the trenches D1 may be formed by using the dry etching method. The trenches D1 are concave parts for filling the element isolation region. That is, an element isolation region with a STI (Shallow Trench Isolation) structure is formed herein.

Figure 10:
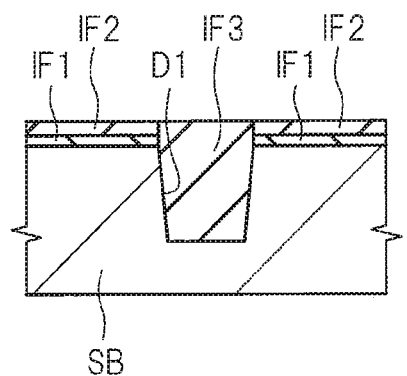
FIG. 10 is a cross-sectional view showing the process of manufacturing the semiconductor device, continued from FIG. 9.

Next, as shown in FIG. 10, after the sidewall of each trench D1 is oxidized, an insulating film IF3 is formed on the semiconductor substrate SB by using, for example, the CVD method, so that the inside of the trench D1 is completely filled, and then, the insulating film IF3 is densified by a heat treatment. Then, by polishing the upper surface of the insulating film IF3 by a CMP (Chemical Mechanical Polishing) method, the insulating film IF3 on the insulating film IF2 is removed to expose the upper surface of the insulating film IF2. In this manner, the insulating films IF3 buried inside the plurality of respective trenches D1 are separated from each other.

Figure 11:
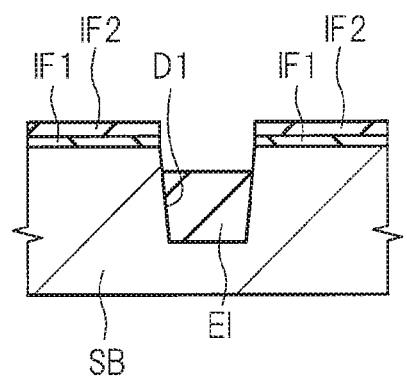
FIG. 11 is a cross-sectional view showing the process of manufacturing the semiconductor device, continued from FIG. 10.

Next, as shown in FIG. 11, the upper surface of the insulating film IF3 is etched back to be recessed. Here, the upper surface of the insulating film IF3 is recessed by using the dry etching method. In this manner, an element isolation region EI made of the insulating film IF3 is formed in each trench D1.

Figure 12:
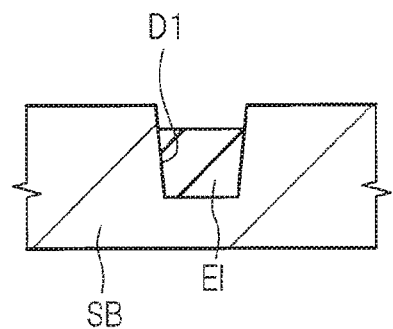
FIG. 12 is a cross-sectional view showing the process of manufacturing the semiconductor device, continued from FIG. 11.

Next, as shown in FIG. 12, the insulating film IF2 as a hard mask and the insulating film IF1 are removed by the wet etching method. Note that usage of the dry etching method can be thought as a method of removing the hard mask. In this manner, the main surface (active region) of the semiconductor substrate SB which is next to the trench D1 is exposed from the hard mask.

One feature of the present embodiment is to form the element isolation region EI whose upper surface is lower than the main surface of the semiconductor substrate SB. Here, by the etching back process described by using FIG. 11 and the etching process described by using FIG. 12, the upper surface of the insulating film IF3 is recessed to form the element isolation region EI whose upper surface is low.

Thus, in the etching back process described by using FIG. 11, etching back is performed until the position of the upper surface of the insulating film IF3 becomes lower than that of the main surface of the semiconductor substrate SB. Alternatively, in the etching process described by using FIG. 12, if the upper surface of the insulating film IF3 can be significantly recessed, the following process may be performed. That is, after the upper surface of the insulating film IF3 may be recessed down to a position that is equal to or higher than the position of the main surface of the semiconductor substrate SB by performing the etching back process described by using FIG. 11, the upper surface of the insulating film IF3 may be recessed in the height down to a position lower than the main surface of the semiconductor substrate SB by the etching process described by using FIG. 12.

Also, in the etching at the time of processing the gate insulating film described later by using FIG. 14 or the etching at the time of processing the sidewall described later by using FIG. 17, the upper surface of the element isolation region EI may be partially removed, so that the upper surface of the element isolation region EI may be recessed down to a position lower than the main surface of the semiconductor substrate SB. Also, a rinsing process may be performed after an ion implanting process which will be described later by using FIG. 17, so that the upper surface of the element isolation region EI may be recessed down to a position lower than the main surface of the semiconductor substrate SB by this rinsing process. In these cases, by performing the etching or the rinsing under a condition with a high selectivity with respect to silicon, the upper surface of the element isolation region EI is recessed while the recession of the surface of the semiconductor substrate is prevented.

Note that the etching to recess the upper surface of the insulating film IF3 may be performed to the insulating film IF3 of the entire wafer. However, the etching may be selectively performed only to the insulating film IF3 adjacent to the memory cell. That is, such a structure as forming a plurality of patterns with a small interval therebetween on the semiconductor substrate SB as in the memory cell formation region may be provided, the structure causing the upper surface of the insulating film IF3 to recess in only a region where the void is easily caused but not actively causing the insulating film IF3 to recess in other regions (such as a peripheral circuit region outside the memory cell) not illustrated. In other words, the recessed amount of the insulating film IF3 in the memory cell region can be larger than the recessed amount of the insulating film IF3 in the peripheral circuit region. In this case, the upper surface of the insulating film IF3 in the memory cell region is lower than the upper surface of the insulating film IF3 in the peripheral circuit region.

Figure 13:
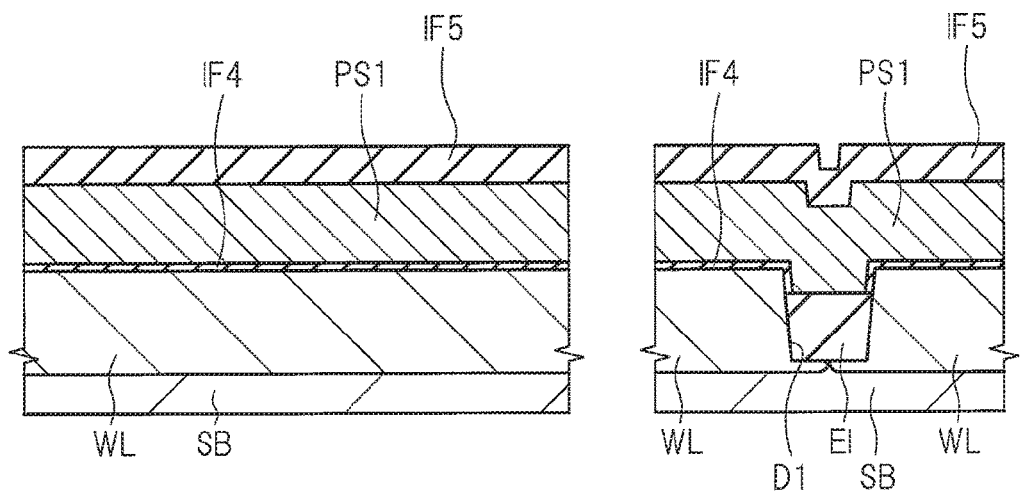
FIG. 13 is a cross-sectional view showing the process of manufacturing the semiconductor device, continued from FIG. 12.

Next, as shown in FIG. 13, a p-type well WL is formed on the main surface of the semiconductor substrate SB. The well WL can be formed by ion implantation of p-type impurities such as B (boron) or others into the semiconductor substrate SB.

Subsequently, an insulating film IF4 for a gate insulating film is formed on the main surface of the semiconductor substrate SB. That is, the insulating film IF4 covering the upper surface of the semiconductor substrate SB exposed from the element isolation region EI is formed. As the insulating film IF4, for example, a silicon oxide film can be used. The insulating film IF4 can be formed by, for example, a thermal oxidation method.

Then, a silicon film PS1 made of a polycrystalline silicon film is formed on the semiconductor substrate SB by using, for example, the CVD method, so as to cover the upper surface of the insulating film IF4. Alternatively, the following is also possible. That is, after the silicon film PS1 is formed as an amorphous silicon film at the time of film formation, the silicon film PS1 made of the amorphous silicon film can be changed into the silicon film PS1 made of a polycrystalline silicon film by a subsequent heat treatment. Also, the silicon film PS1 can be formed as a low-resistance semiconductor film (doped polysilicon film) by, for example, introducing impurities at the time of film formation, ion-implanting the impurities after the film formation, or others. As n-type impurities to be introduced into the silicon film PS1, for example, P (phosphorus) can be preferably used.

Then, an insulating film IF5 is formed on the silicon film PS1 by using, for example, the CVD method. The insulating film IF5 is a cap insulating film made of, for example, SiN (silicon nitride). The insulating film IF5 can have a film thickness of, for example, 20 nm to 50 nm.

Figure 14:
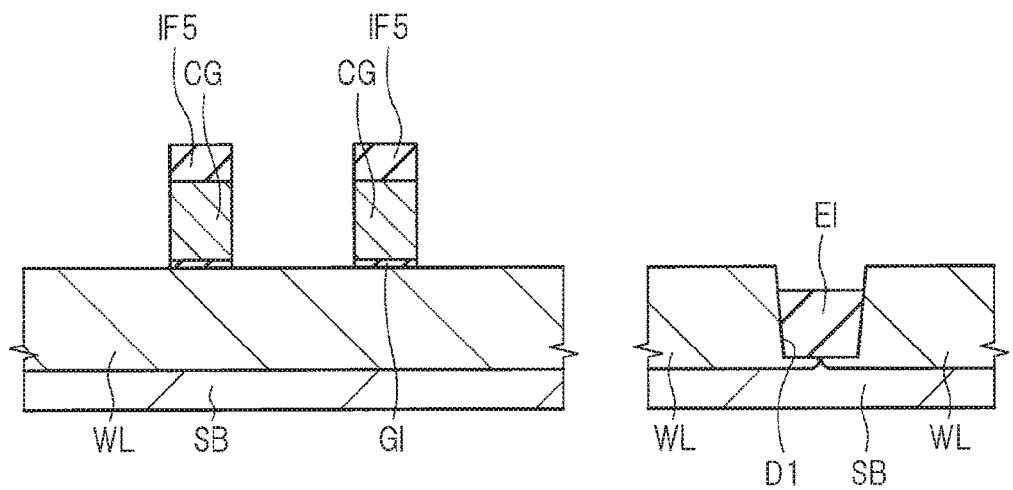
FIG. 14 is a cross-sectional view showing the process of manufacturing the semiconductor device, continued from FIG. 13.

Next, as shown in FIG. 14, a stacked film formed of the insulating film IF5, the silicon film PS1, and the insulating film IF4 is patterned by a photolithography technique and an etching technique. In this manner, a gate insulating film GI is formed of the insulating film IF4. Also, by this etching process, a control gate electrode CG is formed of the silicon film PS1. The control gate electrode CG is a pattern expending in a predetermined direction (first direction or gate width direction) in a plan view. Since the active region shown in the cross section on right in each of FIG. 13 to FIG. 22 is a region where the drain region of the memory cell is to be formed, the main surface of the semiconductor substrate SB is exposed by the processing process of forming the control gate electrode CG from the gate insulating film GI formed of the insulating film IF1, the control gate electrode CG formed of the silicon film PS1, and the insulating film IF5.

The above-described patterning process can be performed as, for example, follows. That is, the insulating film IF5, the silicon film PS1, and the insulating film IF4 are processed by using a photolithography technique and a dry etching technique. In this manner, the control gate electrode CG and the gate insulating film GI are formed. Note that it is also possible to process the insulating film IF5 first by using a photolithography technique and a dry etching technique, and then, process the silicon film PS1 and the insulating film IF4 while using the insulating film IF5 as a mask. Here, as described by using FIG. 7, the control gate electrode CG and the insulating film IF5 immediately above the element isolation region EI are formed at a position lower than the control gate electrode CG and the insulating film IF5 immediately above the main surface of the semiconductor substrate SB.

Figure 15:
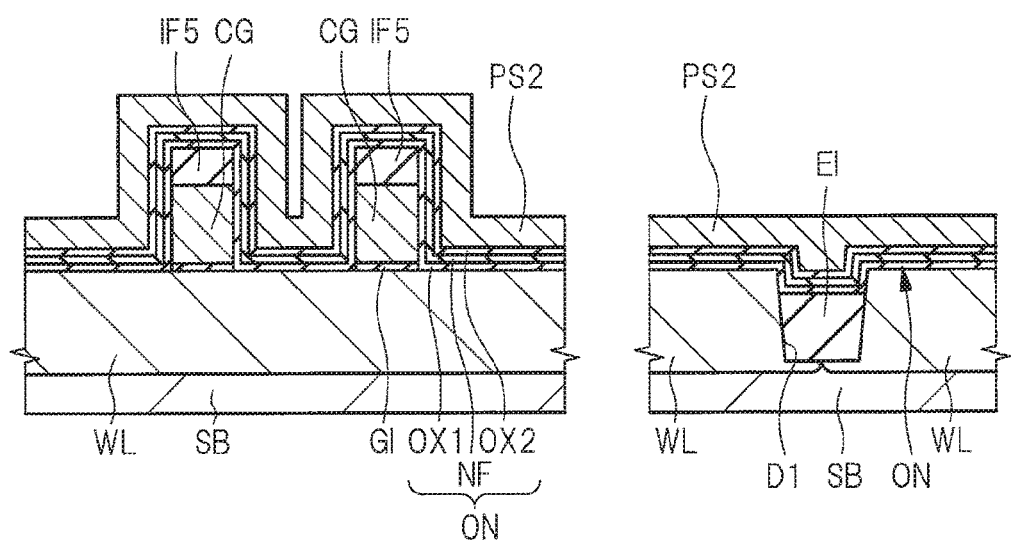
FIG. 15 is a cross-sectional view showing the process of manufacturing the semiconductor device, continued from FIG. 14.

Next, as shown in FIG. 15, an ONO (oxide-nitride-oxide) film ON for a gate insulating film of a memory transistor is formed on the entire main surface of the semiconductor substrate SB. The ONO film ON covers the upper surface of the semiconductor substrate SB and sidewalls and an upper surface of a stacked film formed of the gate insulating film GI, the insulating film IF5, and the control gate electrode CG.

The ONO film ON is an insulating film having a charge storage part therein. Specifically, the ONO film ON is made of a stacked film formed of a silicon oxide film OX1 formed on the semiconductor substrate SB, a silicon nitride film NF formed on the silicon oxide film OX1, and a silicon oxide film OX2 formed on the silicon nitride film NF.

The silicon oxide films OX1 and OX2 can be formed by, for example, oxidation (thermal oxidation), the CVD method, or a combination of them. For oxidation herein, ISSG (In-Situ Steam Generation) oxidation can be also used. The silicon nitride film NF can be formed by, for example, the CVD method.

In the present embodiment, the silicon nitride film NF is formed as an insulating film (charge storage layer) configuring a memory cell and having a trap level. Although a silicon nitride film is suitable for a film used as the charge storage layer in view of reliability and so forth, the film is not limited to a silicon nitride film. For example, a high dielectric constant film (high dielectric constant insulating film) such as an aluminum oxide film (alumina), a hafnium oxide film, or a tantalum oxide film, that has a dielectric constant higher than that of the silicon nitride film can be also used as the charge storage layer or the charge storage part.

The silicon oxide film OX1 can have a thickness of, for example, about 2 nm to 10 nm. The silicon nitride film NF can have a thickness of, for example, about 5 nm to 15 nm. The silicon oxide film OX2 can have a thickness of, for example, about 2 nm to 10 nm.

Subsequently, a polycrystalline silicon film PS2 is formed on the entire main surface of the semiconductor substrate SB so as to cover the surface of the ONO film ON by using, for example, the CVD method. Thus, the exposed surface of the ONO film ON is covered with the silicon film PS2. That is, the silicon film PS2 is formed on the sidewalls of the control gate electrode CG via the ONO film ON.

The silicon film PS2 has a film thickness of, for example, 40 nm. Alternatively, after the silicon film PS2 is formed as an amorphous silicon film at the time of film formation, the silicon film PS2 made of the amorphous silicon film can be changed into the silicon film PS2 made of a polycrystalline silicon film by a subsequent heat treatment. The silicon film PS2 is a film to which, for example, p-type impurities (for example, B (boron)), are introduced with relatively high concentration. The silicon film PS2 is a film for forming a memory gate electrode, which will be described later.

Figure 16:
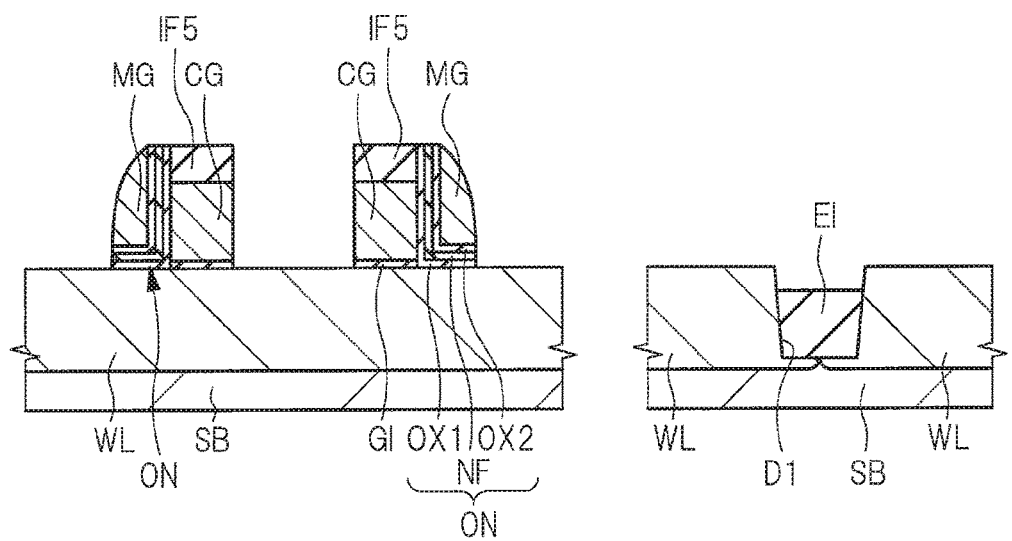
FIG. 16 is a cross-sectional view showing the process of manufacturing the semiconductor device, continued from FIG. 15.

Next, as shown in FIG. 16, the silicon film PS2 is etched back (etched, dry-etched, or anisotropically etched) by an anisotropic etching technique, so that the upper surface of the ONO film ON is exposed. In this etching back process, the silicon film PS2 is anisotropically etched (etched back), so that the sidewall-shaped silicon film PS2 is left via the ONO film ON sidewalls on both sidewalls of the stacked film (gate stack) formed of the gate insulating film GI, the insulating film IF5, and the control gate electrode CG.

In this manner, a memory gate electrode MG made of the sidewall-shaped silicon film PS2 left via the ONO film ON is formed on one of the sidewalls of the gate stack.

Subsequently, by using a photolithography technique, a resist film (not illustrated) which covers the memory gate electrode MG adjacent to one sidewall of the control gate electrode CG and which exposes the silicon film PS2 adjacent to the other sidewall of the control gate electrode CG is formed on the semiconductor substrate SB. Then, by performing the etching while using the resist film as an etching mask, the silicon film PS2 formed on the opposite side of the memory gate electrode MG across the control gate electrode CG is removed. Then, the resist film is removed. In this etching process, the memory gate electrode MG is covered with the resist film, and therefore, is not etched and left. Note that the dry etching or the wet etching may be performed as this etching.

Subsequently, a part of the ONO film ON is removed by etching (for example, wet etching), the part being to be not covered with the memory gate electrode MG but exposed. Here, the ONO film ON immediately below the memory gate electrode MG is not removed but left. Similarly, the ONO film ON positioned between the gate stack including the control gate electrode CG and the memory gate electrode MG is not removed but left. Since the ONO films ON in the other regions are removed, the upper surface of the semiconductor substrate SB is exposed. Also, one sidewall of the control gate electrode CG, the sidewall being not adjacent to the memory gate electrode MG, is exposed. Also, the upper surface of the active region exposed from the control gate electrode CG and the memory gate electrode MG is exposed from the silicon film PS2 and the ONO film ON.

In this manner, the memory gate electrode MG is formed on the semiconductor substrate SB via the ONO film ON having the charge storage part therein, so as to be adjacent to the control gate electrode CG.

Figure 17:
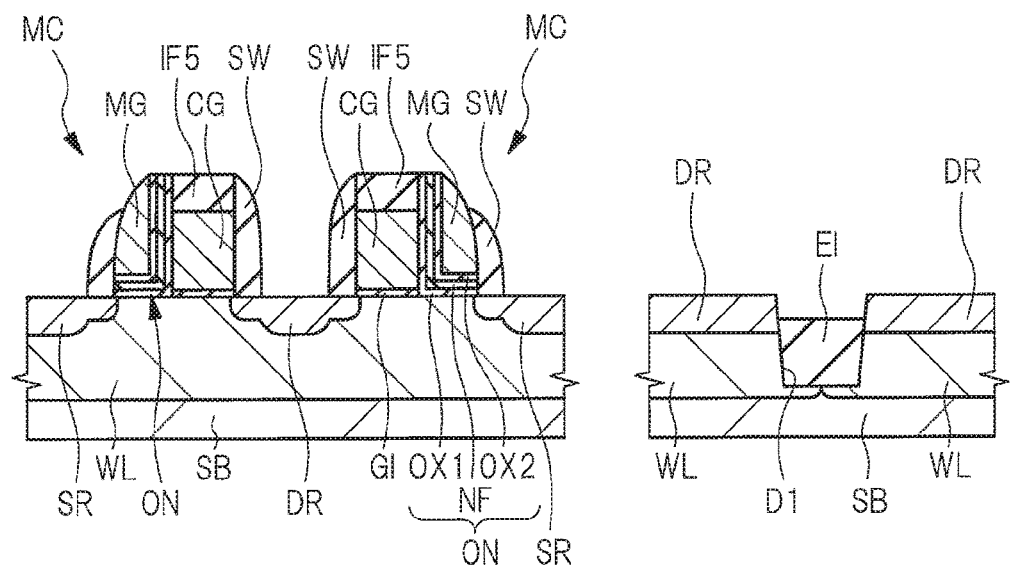
FIG. 17 is a cross-sectional view showing the process of manufacturing the semiconductor device, continued from FIG. 16.

Next, as shown in FIG. 17, a plurality of extension regions (n⁻-type semiconductor regions or impurity diffusion regions) are formed by using an ion implantation method or others. That is, n-type impurities such as As (arsenic) or P (phosphorus) are introduced to the semiconductor substrate SB by the ion implantation method while using the insulating film IF5, the gate insulating film GI, the control gate electrode CG, the memory gate electrode MG, the ONO film ON, and so forth as a mask, so that a plurality of extension regions are formed. Before the extension regions are formed, an offset spacer used for covering sidewalls of a pattern including the gate insulating film GI, the control gate electrode CG, the insulating film IF5, the ONO film ON, and the memory gate electrode MG may be formed of, for example, a silicon nitride film, a silicon oxide film, a stacked film of them, or others.

Subsequently, sidewalls SW which cover the sidewalls on both sides of the pattern including the control gate electrode CG and the memory gate electrode MG are formed. The sidewalls SW can be formed to be self-aligned by sequentially forming, for example, a silicon oxide film and a silicon nitride film on the semiconductor substrate SB by using the CVD method or others, and then, partially removing the silicon oxide film and the silicon nitride film by anisotropic etching to expose the upper surface of the semiconductor substrate SB and the upper surface of the insulating film IF5. That is, while it can be thought that the sidewalls SW are formed of a stacked film, an interface between films configuring the stacked film is not illustrated in the drawing.

Subsequently, a diffusion region (n⁺-type semiconductor region, impurity diffusion region) is formed by using an ion implantation method or others. That is, n-type impurities (for example, P (phosphorus) or As (arsenic)) are introduced to the semiconductor substrate SB by using the ion implantation method using the gate insulating film GI, the control gate electrode CG, the insulating film IF5, the ONO film ON, the memory gate electrode MG, and the sidewalls SW as a mask (ion implantation inhibiting mask), so that the diffusion region is formed. The diffusion region has an impurity concentration higher than that of the extension region and a junction depth deeper than that of the extension region.

In this manner, a source/drain region which is formed of the extension region and the diffusion region with an impurity concentration higher than that of the extension region and which has a LDD (Lightly Doped Drain) structure is formed.

The extension region and the diffusion region formed on the upper surface of the semiconductor substrate SB next to the pattern including the control gate electrode CG and the memory gate electrode MG configure the source/drain region. That is, the extension region and the diffusion region formed on the main surface of the semiconductor substrate SB in a region adjacent to the control gate electrode CG configure a drain region DR, and the extension region and the diffusion region formed on the main surface of the semiconductor substrate SB in a region adjacent to the memory gate electrode MG configure a source region SR.

Subsequently, activation annealing is performed as a heat treatment to activate the impurities introduced to the source region SR, the drain region DR, and so forth. In this manner, the structure shown in FIG. 17 is obtained. This manner forms a memory cell MC of a MONOS type memory as a non-volatile memory including the control gate electrode CG, the memory gate electrode MG, the ONO film ON, the source region SR, and the drain region DR. Memory cells MC adjacent to each other share the drain region DR. Also, as shown on right in FIG. 17, drain regions DR configuring two respective memory cells MC which share the control gate electrode CG and the memory gate electrode MG are formed in the respective active regions on both sides across the element isolation region EI.

Figure 18:
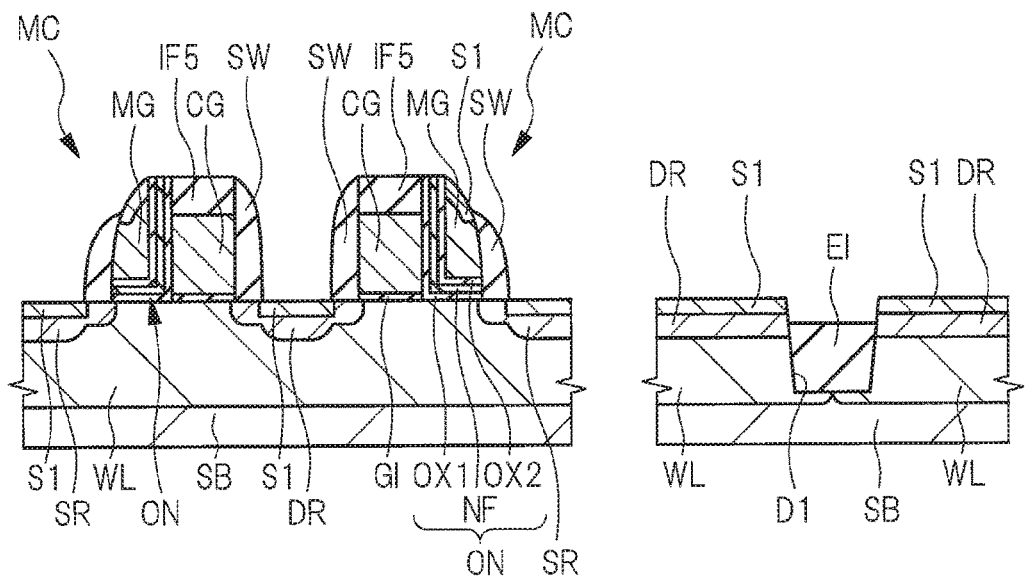
FIG. 18 is a cross-sectional view showing the process of manufacturing the semiconductor device, continued from FIG. 17.

Next, as shown in FIG. 18, a silicide layer S1 is formed by performing a so-called Salicide (Self Aligned Silicide) process. Specifically, the silicide layer S1 can be formed as follows.

That is, a metal film for formation of a silicide layer is formed (deposited) on the entire main surface of the semiconductor substrate SB including the upper surface of the diffusion region and the upper surface of the memory gate electrode MG. The metal film is formed of, for example, an alloy film of Ni (nickel) and Pt (platinum), and can be formed by using a sputtering method. The metal film may mainly contain Co (cobalt) in place of nickel.

Subsequently, by performing a heat treatment on the semiconductor substrate SB, each surface layer portion of the diffusion region and the memory gate electrode MG can be caused to react with the metal film. By this reaction, that is, by silicidation, the silicide layer S1 is formed on an upper portion of each of the diffusion region and the memory gate electrode MG. Then, the metal film which has not reacted even by the heat treatment is removed by wet etching or others.

Note that the upper surface of the control gate electrode CG is covered with the insulating film IF5 as a cap film. Therefore, the silicide layer S1 is not formed on the upper portion of the control gate electrode CG. However, when the insulating film IF5 is not formed, the silicide layer S1 is formed also on the upper surface of the control gate electrode CG. The silicide layer S1 is formed in contact with the upper surface of the diffusion region of each of the source region SR and the drain region DR.

Figure 19:
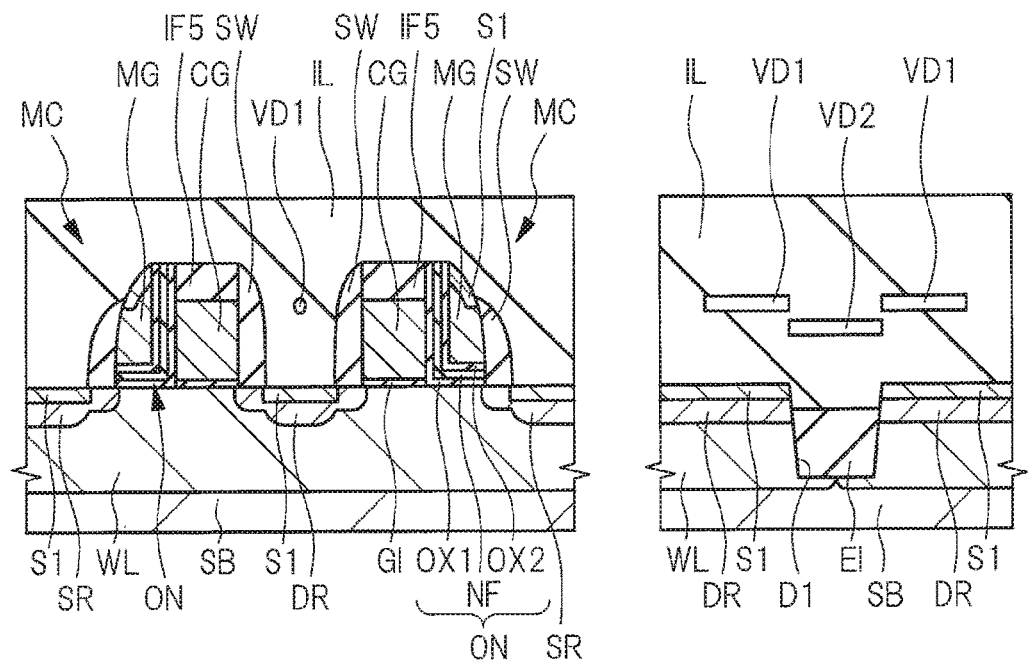
FIG. 19 is a cross-sectional view showing the process of manufacturing the semiconductor device, continued from FIG. 18.

Next, as shown in FIG. 19, an interlayer insulating film IL formed of a silicon oxide film and a liner film functioning as an etching stopper film is formed on the entire main surface of the semiconductor substrate SB so as to cover the control gate electrode CG, the memory gate electrode MG, and the sidewalls SW. The liner film is formed of, for example, a silicon nitride film, and can be formed by, for example, the CVD method. The liner film can be used as an etching stopper film when a contact hole is formed in a later process. The silicon oxide film can be formed by using, for example, a coating method, the CVD method, or others.

In FIG. 19, the liner film and the silicon oxide film are shown as one layer, and a boundary therebetween is not illustrated. The silicon oxide film has a film thickness larger than the film thickness of the liner film. Also herein, the interlayer insulating film IL is formed so as to have a film thickness larger than a distance obtained by adding the film thickness of the gate stack including the control gate electrode CG to a height difference (the distance "a" shown in FIG. 6) between the main surface of the semiconductor substrate SB and the upper surface of the element isolation region EI in the active region.

Here, a void VD1 surrounded by the interlayer insulating film IL is formed in a portion between two gate stacks, the portion being immediately above the drain region DR formed in the active region. Also, a void VD2 surrounded by the interlayer insulating film IL is formed in a portion between two gate stacks, the portion being immediately above the element isolation region EI. Each of the voids VD1 and VD2 has a shape extending in the Y direction along the main surface of the semiconductor substrate. Each of the voids VD1 and VD2 is a burying defect portion caused by poor burying capability of the interlayer insulating film IL between the gate stacks adjacent to each other.

However, while two voids VD1 formed immediately above the main surface of the semiconductor substrate SB in the respective adjacent active regions are positioned at the same height as each other from the main surface of the semiconductor substrate SB in the height direction, the formation position of the void VD2 is lower than the formation position of the void VD1. In addition, a difference in the formation position between the voids VD1 and VD2 in the height direction is larger than the thickness of each of the voids VD1 and VD2 in the height direction.

Thus, while the voids VD1 and VD2 are formed side by side in a plan view, the voids VD1 and VD2 are formed at different heights from each other, and therefore, are not connected to each other. This is because the voids VD1 and VD2 are formed at a certain height position from a surface of a base of the interlayer insulating film IL which covers the voids VD1 and VD2, the base being immediately below each of the voids VD1 and VD2. The above-described base of the interlayer insulating film IL which covers the void VD1 means the main surface of the semiconductor substrate SB in the active region, and the above-described base of the interlayer insulating film IL which covers the void VD2 means the upper surface of the element isolation region EI.

Then, by using, for example, the CMP (Chemical Mechanical Polishing) method, the upper surface of the interlayer insulating film IL is flattened. In this manner, the structure shown in FIG. 19 is obtained. Note that two voids VD1 and one void VD2 caused in a narrow range between two active regions are described herein. However, it can be thought that a plurality of voids VD1 and VD2 are formed alternately in the Y direction in a plan view. Also in this case, the voids VD2 are formed only immediately above the element isolation region EI.

A surface of each of the voids VD1 and VD2 along the X direction and the Z direction has, for example, an oval cross section. Also, each of the voids VD1 and VD2 extends in the Y direction. That is, each of the voids VD1 and VD2 has a columnar three-dimensional shape.

Figure 20:
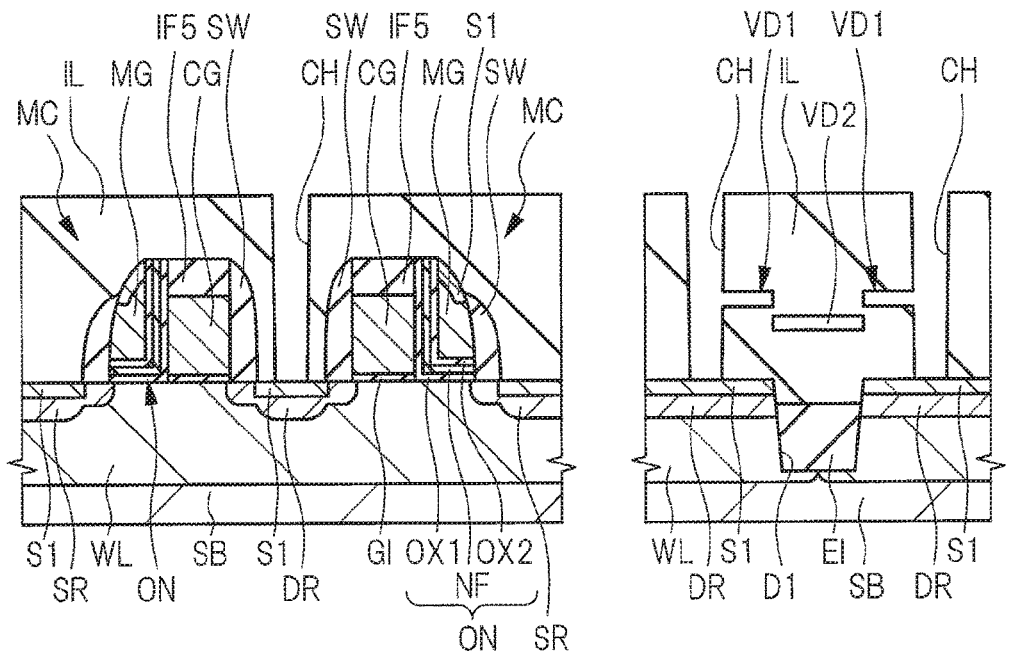
FIG. 20 is a cross-sectional view showing the process of manufacturing the semiconductor device, continued from FIG. 19.

Next, as shown in FIG. 20, the interlayer insulating film IL is etched by using a photolithography technique using a resist film (not illustrated) formed on the interlayer insulating film IL as an etching mask. In this manner, a plurality of contact holes (openings or through holes) CH penetrating through the interlayer insulating film IL are formed.

On a bottom part of each contact hole CH, for example, a part of the silicide layer S1 on the surface of the diffusion region formed on the main surface of the semiconductor substrate SB, a part of the silicide layer S1 on the surface of the memory gate electrode MG, and so forth are exposed. Note that the contact hole on each of the gate electrode and the source region SR is formed in a region not illustrated in FIG. 20. FIG. 20 shows only the contact hole CH immediately above the drain region DR.

Here, the position where the contact hole CH is formed partially overlaps a portion where the void VD1 is formed in a plan view. In other words, the contact hole CH penetrating through the interlayer insulating film IL is formed from immediately above a part of the void VD1. That is, a part of the void VD1 is removed by the formation of the contact hole CH, and another part of the void VD1 is connected to a sidewall of the contact hole CH. In this manner, the surface of the void VD1 is exposed by formation of the contact hole CH.

Here, the void VD2 is separated from the void VD1, and the contact hole CH is not formed at the position overlapping the void VD2 in a plan view. Therefore, even if the contact hole CH is formed, the void VD2 is not exposed. That is, the void VD2 is not in contact with the contact hole CH.

Figure 21:
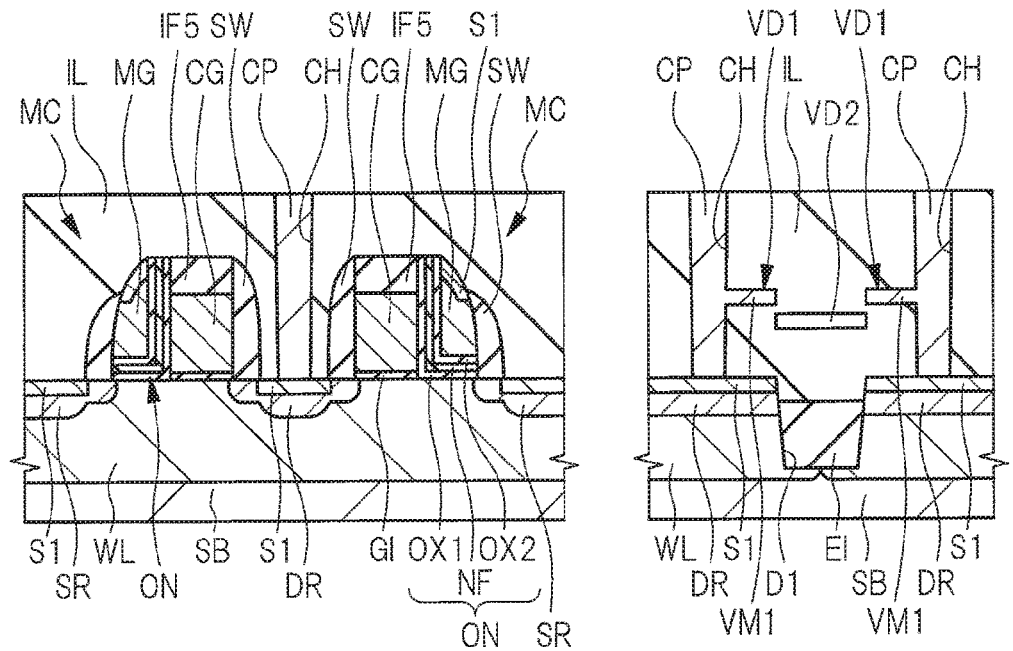
FIG. 21 is a cross-sectional view showing the process of manufacturing the semiconductor device, continued from FIG. 20.

Next, as shown in FIG. 21, in each contact hole CH, a conductive contact plug CP mainly made of tungsten (W) or others is formed as a conductor for connection (connecting part). In order to form the contact plug CP, for example, a barrier conductive film (for example, a titanium film, a titanium nitride film, or a stacked film of them) is formed on the interlayer insulating film IL including the inside of the contact hole CH. Then, on this barrier conductive film, a main conductive film made of a tungsten film or others is formed so as to completely fill the inside of each contact hole CH, and then, unnecessary portions of the main conductive film and the barrier conductive film outside the contact hole CH are removed by the CMP method, the etching back method, or others, so that the contact plug CP is formed. For simplification of the drawing, note that FIG. 21 integrally shows the barrier conductive film and the main conductive film (tungsten film) configuring the contact plug CP.

The contact plug CP buried in the contact hole is formed so as to be connected to an upper portion of the source region SR, the drain region DR, the control gate electrode CG, or the memory gate electrode MG. That is, the contact plug CP is connected via the silicide layer S1 to each upper surface of the source region SR and the drain region DR of the memory cell MC. Also, to the upper surface of the memory gate electrode MG, the contact plug CP is connected via the silicide layer S1. However, in the drawing, only the contact plug CP connected to the drain region DR is shown.

Here, immediately above the semiconductor substrate SB in the active region, a metal film VM1 made of the same conductive member as the conductive member configuring the contact plug CP is formed in the void VD1 whose surface is exposed as being connected to the contact hole CH. On the other hand, the void VD2 is not exposed in the process of forming the contact plug CP, and its surrounding is completely covered with the interlayer insulating film IL, and therefore, no metal film is formed in the void VD2.

Figure 22:
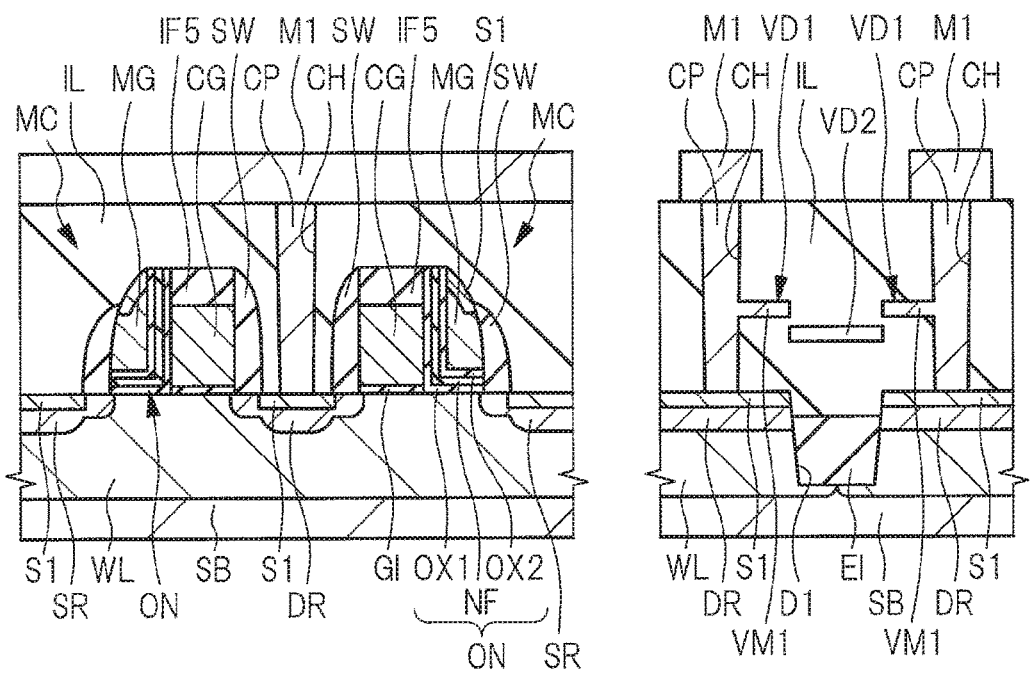
FIG. 22 is a cross-sectional view showing the process of manufacturing the semiconductor device, continued from FIG. 21.

Next, as shown in FIG. 22, a plurality of wirings M1 are formed on the interlayer insulating film IL and the contact plug CP. Here, for example, after another interlayer insulating film (not illustrated) is formed on the interlayer insulating film IL, a wiring trench which penetrates through the other interlayer insulating film to expose the upper surface of the contact plug CP is formed, and then, a metal film which fills the wiring trench is formed, so that the wiring M1 made of the metal film can be formed. The wiring M1 is made of, for example, Cu (copper).

Thereafter, a stacked wiring layer is formed by forming a plurality of wiring layers on the wiring M1, and then, the semiconductor wafer is divided into pieces by a dicing process to obtain a plurality of semiconductor chips. In this manner described above, the semiconductor device of the present embodiment is manufactured.

<Regarding Effect of Method of Manufacturing Semiconductor Device>

In the following, effects of method of manufacturing the semiconductor device of the present embodiment are described.

As described by using FIG. 26, advancement of the microfabrication of the semiconductor device causes the problem of the voids in the interlayer insulating film between the patterns on the substrate, which results in the short circuit between the contact plugs adjacent to each other across this void because of the conductive film buried in the void.

On the other hand, if the patterns are separated from each other so as not to cause the void, the microfabrication of the semiconductor device is prevented. Also, when the gate electrode is formed on the substrate, it is difficult to prevent the occurrence of the void by reducing the height of the gate electrode in view of preventing an increase of the resistance value of the gate electrode or in view of using the gate electrode as an injection inhibiting film. Also, in a split-gate MONOS memory cell, it is difficult to prevent the occurrence of the void by reducing the height of the gate stack including the control gate electrode in view of keeping perpendicularity of the memory gate electrode.

On the other hand, in the process described by using FIG. 11 and FIG. 12 in the method of manufacturing the semiconductor device of the present embodiment, the upper surface of the element isolation region EI is recessed toward the back surface opposite to the main surface of the semiconductor substrate SB. In this manner, the upper surface of the element isolation region EI is positioned to be lower than the main surface of the semiconductor substrate SB. Thus, formation positions of the gate stack including the control gate electrode CG, the memory gate electrode MG, and the sidewalls SW shown in FIG. 13 to FIG. 19 are lower than formation positions of the gate stack, the memory gate electrode MG, and the sidewalls SW immediately above the semiconductor substrate SB in the active region adjacent to the element isolation region EI.

Also, the formation position of the void VD2 formed immediately above the element isolation region EI among the voids formed in the interlayer insulating film IL (see FIG. 19) is lower than the formation position of the void VD1 formed immediately above the main surface of the semiconductor substrate SB in the active region next to the element isolation region EI. Here, as shown in FIG. 6, since the distance "a" indicating the recessed amount of the upper surface of the element isolation region EI from the main surface of the semiconductor substrate SB is larger than the thickness (distance) "b" of each of the void VD1 and the void VD2, the voids extending along the gate stack including the control gate electrode CG are separated from each other on a boundary between the element isolation region EI and the active region.

Thus, when the contact hole CH shown in FIG. 20 is formed immediately above the drain region DR formed in the active region, the contact hole CH can be connected to the void VD1, but is not connected to the void VD2 positioned above the element isolation region EI between the drain regions DR adjacent to each other. Therefore, even if two contact plugs shown in FIG. 21 are formed, a conductive film is not buried in the void VD2 between these contact plugs.

Therefore, the occurrence of the short circuit between the contact plugs CP can be prevented by the burying of the conductive film into the void formed in the interlayer insulating film IL, and therefore, the reliability of the semiconductor device can be improved. Also, microfabrication of an element group is not prevented because the occurrence of the void is prevented, and therefore, the microfabrication of the semiconductor device can be achieved, so that the performance of the semiconductor device can be improved.

In the method of manufacturing the semiconductor device of the present embodiment, the above-described effects can be obtained by increasing the recessed amount of the upper surface of the element isolation region EI, and therefore, it is not required to newly prepare a mask for the patterning, so that increase of a manufacturing cost can be suppressed.

First Modification Example

Figure 24:
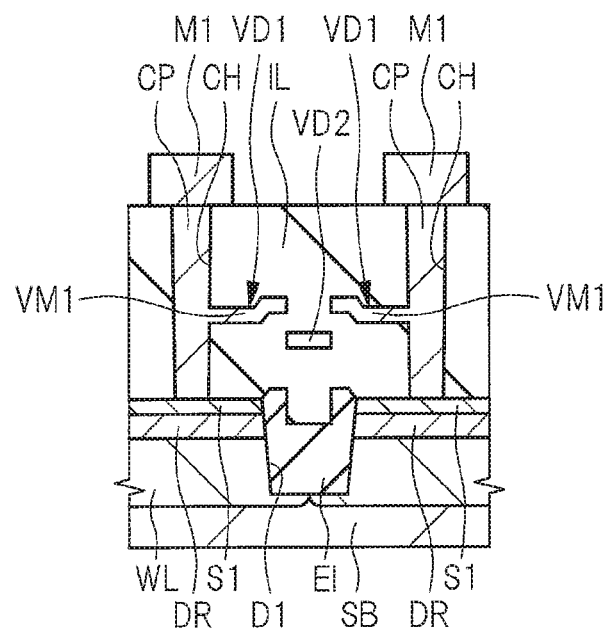
FIG. 24 is a cross-sectional view showing a process of manufacturing a semiconductor device according to a first modification example of the embodiment of the present invention.

As shown in FIG. 24, as a first modification example of the present embodiment, a part of the upper surface of the element isolation region EI may be recessed, and the void VD2 may be formed immediately above the element isolation region EI at a position lower than the main surface of the semiconductor substrate SB. FIG. 24 is a cross-sectional view corresponding to FIG. 22, which shows a process of manufacturing a semiconductor device of a modification example of the present embodiment.

In the modification example, the recessed amount of the upper surface of the element isolation region EI in the process described by using FIG. 11 and FIG. 12 is suppressed so that the height of the uppermost surface of the element isolation region EI is made equal to the height of the main surface of the semiconductor substrate SB or higher than the height of the main surface. Furthermore, by using a photolithography technique and a dry etching method, a process of recessing a part of the upper surface of the element isolation region EI so as to be lower than the main surface of the semiconductor substrate SB is performed. This etching process can be performed at any of timings, for example, between the process described by using FIG. 10 and the process described by using FIG. 13, between the process described by using FIG. 13 and the process described by using FIG. 15, and between the process described by using FIG. 15 and the process described by using FIG. 19.

In the present modification example, the void VD1 and the metal film VM1 are formed not only immediately above the active region but also formed so as to extend a portion immediately above an end of the element isolation region EI. This end of the element isolation region EI indicates a region where the upper surface of the element isolation region EI is positioned to be equal to or higher than the main surface of the semiconductor substrate SB. In such a semiconductor device, a position of a part of the upper surface of the element isolation region EI is higher than the main surface of the semiconductor substrate SB, and a position of another part of the upper surface of the element isolation region EI is lower than the main surface of the semiconductor substrate SB.

In other words, the upper surface of the element isolation region EI has a first upper surface and a second upper surface, the void VD2 is formed immediately above the first upper surface, which is a bottom surface of a trench (concave part) in the upper surface of the element isolation region EI, the position of the second upper surface of the element isolation region EI next to the trench is higher than the main surface of the semiconductor substrate SB, and the position of the first upper surface is lower than the main surface of the semiconductor substrate SB.

Also in the present modification example, effects similar to those of the semiconductor device or the method of manufacturing the semiconductor device described by using FIG. 1 to FIG. 22 can be obtained.

Second Modification Example

Figure 25:
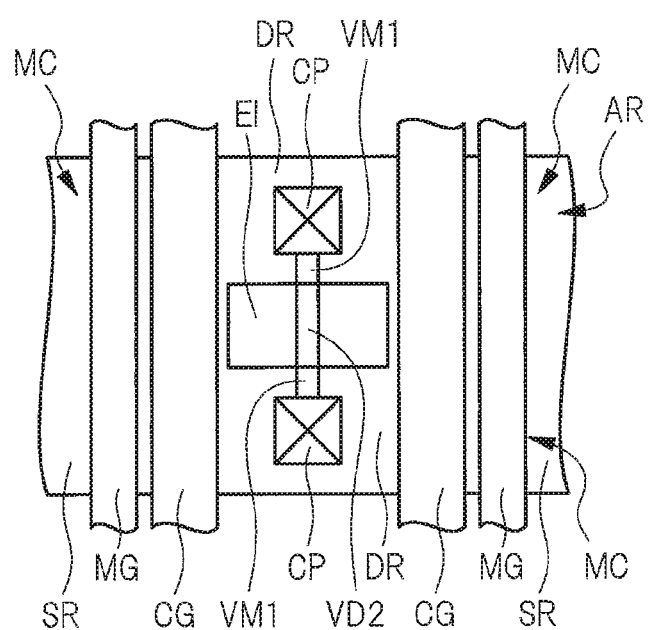
FIG. 25 is a plan view showing a semiconductor device according to a second modification example of the embodiment of the present invention.

FIG. 25 shows a plan view of a semiconductor device of a second modification example of the present embodiment. FIG. 25 is a plan view corresponding to FIG. 2.

As shown in FIG. 25, the element isolation region EI may not extend in the X direction. That is, the control gate electrode CG and the memory gate electrode MG may not be formed immediately below the element isolation region EI. In the present modification example, the element isolation region EI is formed only between the drain regions DR adjacent to each other in the Y direction. That is, in a plan view, the element isolation region EI is formed only between the contact plugs CP adjacent to each other in the Y direction, and the void VD2 is formed immediately above the element isolation region EI.

That is, a gate stack is formed immediately above each main surface of the semiconductor substrates SB sandwiching the element isolation region EI in the X direction. The other structures are similar to those of the semiconductor device described by using FIG. 1 to FIG. 7. Note that the drain regions DR adjacent to each other in the Y direction are electrically isolated from each other. To these drain regions DR, different voltages from each other can be applied at the time of operation of the MONOS memory.

As described above, even if the formation position of the element isolation region EI is limited to be between the drain regions DR adjacent to each other, effects similar to those of the semiconductor device and the method of manufacturing the semiconductor device described by using FIG. 1 to FIG. 22 can be obtained.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:

1. A semiconductor device, comprising:
   a semiconductor substrate;
   an element isolation region that is buried in a trench formed in a main surface of the semiconductor substrate and that has an upper surface positioned to be lower than the main surface of the semiconductor substrate;
   an interlayer insulating film formed on the semiconductor substrate and on the element isolation region;
   a first connecting part and a second connecting part that penetrate through the interlayer insulating film and that are formed so as to sandwich the element isolation region therebetween in the plan view;
   a first conductive film that is formed in the interlayer insulating film between the first connecting part and the second connecting part and that is connected to the first connecting part;
   a second conductive film that is formed in the interlayer insulating film between the first connecting part and the second connecting part and that is connected to the second connecting part; and
   a void that is positioned between the first conductive film and the second conductive film in the plan view and that is formed in the interlayer insulating film immediately above the element isolation region,
   wherein, with respect to the main surface of the semiconductor substrate, an upper surface of the void is positioned to be lower than a bottom surface of the first conductive film and a bottom surface of the second conductive film.

2. The semiconductor device according to claim 1, wherein a distance between the main surface of the semiconductor substrate and the upper surface of the element isolation region, in a direction perpendicular to the main surface of the semiconductor substrate, is larger than a thickness of each of the first conductive film, the second conductive film, and the void.

3. The semiconductor device according to claim 1, further comprising:
   two patterns that are formed on the semiconductor substrate and that extend in a first direction along the main surface of the semiconductor substrate,
   wherein the two patterns are arranged side by side in a second direction orthogonal to the first direction,
   wherein the first connecting part, the first conductive film, the void, the second conductive film, and the second connecting part are sequentially arranged side by side in the first direction in the plan view, and
   wherein the first conductive film, the void, and the second conductive film are positioned between the two patterns adjacent to each other in the second direction.

4. The semiconductor device according to claim 3, further comprising:
   a first drain region formed on a part of the main surface of the semiconductor substrate, the part being immediately below the first connecting part; and
   a second drain region formed on a part of the main surface of the semiconductor substrate, the part being immediately below the second connecting part,
   wherein the first connecting part and the second connecting part are positioned between the two patterns adjacent to each other in the second direction,
   wherein each of the two patterns configures a first gate electrode,
   wherein the first drain region and the first gate electrode configure a first field effect transistor, and wherein the second drain region and the first gate electrode configure a second field effect transistor.

5. The semiconductor device according to claim 4, further comprising:
a second gate electrode formed so as to be adjacent to a second sidewall of the first gate electrode, the second sidewall being opposite to a first sidewall that faces the first connecting part and the second connecting part;
a charge storage part that interposes between the first gate electrode and the second gate electrode and between the second gate electrode and the main surface of the semiconductor substrate; and
a first source region and a second source region formed on the main surface of the semiconductor substrate,
wherein the first drain region and the first source region are arranged so as to sandwich the first gate electrode and the second gate electrode in the second direction in the plan view,
wherein the second drain region and the second source region are arranged so as to sandwich the first agate electrode and the second gate electrode in the second direction in the plan view,
wherein the first gate electrode, the second gate electrode, the charge storage part, the first drain region, and the first source region configure a first memory cell, and
wherein the first gate electrode, the second gate electrode, the charge storage part, the second drain region, and the second source region configure a second memory cell.

6. The semiconductor device according to claim 5, further comprising an insulating film formed on the first gate electrode,
wherein the second gate electrode is formed next to one sidewall of a stacked film including the first gate electrode and the insulating film.

7. The semiconductor device according to claim 1, wherein the void is separated from the bottom surface of the first conductive film and the second conductive film in a direction perpendicular to the main surface of the semiconductor substrate.

8. The semiconductor device according to claim 3, wherein the two patterns are formed immediately above the main surfaces of parts of the semiconductor substrate that sandwich the element isolation region therebetween the second direction.

9. The semiconductor device according to claim 3, wherein the element isolation region extends in the second direction, and
wherein a height of a first upper surface of each of the two patterns immediately above parts of the element isolation region is lower than a height of a second upper surface of each of the two patterns immediately above the main surfaces of the parts of the semiconductor substrate adjacent to the element isolation region in the first direction.

10. The semiconductor device according to claim 1, wherein
the void is formed immediately above the upper surface of the element isolation region.

11. The semiconductor device according to claim 1, wherein, in the plan view, the void is positioned outside of the first conductive film and the second conductive film.

12. The semiconductor device according to claim 1, wherein, in the plan view, an entirety of the void is positioned outside of the first conductive film and the second conductive film.

13. The semiconductor device according to claim 1, wherein, with respect to the main surface of the semiconductor substrate, an upper surface of the first conductive film is located lower than an upper surface of the first connecting part.

14. The semiconductor device according to claim 1, wherein the interlayer insulating film is disposed on an upper surface of the first conductive film and an upper surface of the second conductive film.

15. The semiconductor device according to claim 1, wherein the interlayer insulating film is disposed between the upper surface of the void and the bottom surface of the first conductive film.

16. A method of manufacturing a semiconductor device, comprising:
(a) preparing a semiconductor substrate having a first region, a second region, and a third region sequentially arranged along a main surface;
(b) forming a trench in the main surface of the semiconductor substrate in the second region;
(c) burying a first insulating film into the trench;
(d) recessing an upper surface of the first insulating film down to a position lower than the main surface of the semiconductor substrate;
(e) forming, on the semiconductor substrate, an interlayer insulating film including therein a first void immediately above the main surface of the semiconductor substrate in the first region, a third void immediately above the main surface of the semiconductor substrate in the third region, and a second void that is formed to be lower than the first void and the third void and that is positioned immediately above the first insulating film;
(f) forming a first connection hole that penetrates through the interlayer insulating film in the first region and that is connected to the first void and a second connection hole that penetrates through the interlayer insulating film in the third region and that is connected to the third void; and
(g) forming a first connecting part in the first connection hole and a second connecting part in the second connection hole.

17. The method of manufacturing the semiconductor device according to claim 16, wherein, after the (f), a distance between the main surface of the semiconductor substrate and the upper surface of the first insulating film in a direction perpendicular to the main surface of the semiconductor substrate is larger than a thickness of each of the first void, the second void, and the third void.

18. The method of manufacturing the semiconductor device according to claim 16, wherein, in the (g), the first connecting part, a first conductive film that is connected to the first connecting part and that is buried into the first void, the second connecting part, and a second conductive film that is connected to the second connecting part and that is buried into the third void are formed.

19. The method of manufacturing the semiconductor device according to claim 16, further comprising:
(d1) after the (d), forming paired first gate electrodes on the semiconductor substrate so as to sandwich the first region, the second region, and the third region, that are arranged side by side in a first direction, in a second direction orthogonal to the second region;
(d2) before the step of (e), forming a second gate electrode adjacent to a second sidewall of the paired first gate electrodes, the second sidewall facing but being opposite to a first sidewall of each of the paired first gate electrodes, and forming a charge storage part that interposes between the second gate electrode and the first gate electrode and between the second gate electrode and the main surface of the semiconductor substrate; and (d3) before the (e), forming a first drain region on the main surface of the semiconductor substrate in the first region, forming a second drain region on the main surface of the semiconductor substrate in the third region, and forming a first source region and a second source region on the main surface of the semiconductor substrate, wherein, in the (e), a part of the interlayer insulating film is buried between the paired first gate electrodes extending in the first direction to form the first void, the second void, and the third void between the paired first gate electrodes, wherein the first gate electrode, the second gate electrode, the charge storage part, the first drain region, and the first source region configure a first memory cell, and wherein the first gate electrode, the second gate electrode, the charge storage part, the second drain region, and the second source region configure a second memory cell.

20. The method of manufacturing the semiconductor device according to claim 16, wherein, in the (d), a first upper surface which is a part of the first insulating film is recessed down to a position lower than the main surface, wherein a second upper surface which is another part of the first insulating film is positioned to be higher than the main surface, and wherein the second void is formed immediately above the first upper surface.

* * * * *